US012356659B2

(12) United States Patent
Lee et al.

(10) Patent No.: US 12,356,659 B2
(45) Date of Patent: Jul. 8, 2025

(54) SEMICONDUCTOR DEVICE

(71) Applicant: SAMSUNG ELECTRONICS CO., LTD., Suwon-si (KR)

(72) Inventors: Doohyun Lee, Hwaseong-si (KR);
Heonjong Shin, Yongin-si (KR);
Hyunho Park, Suwon-si (KR);
Minchan Gwak, Hwaseong-si (KR);
Seon-Bae Kim, Hwaseong-si (KR);
Jinyoung Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 500 days.

(21) Appl. No.: 17/834,987

(22) Filed: Jun. 8, 2022

(65) Prior Publication Data
US 2023/0115743 A1 Apr. 13, 2023

(30) Foreign Application Priority Data

Oct. 1, 2021 (KR) ........................ 10-2021-0130652

(51) Int. Cl.
*H01L 29/786* (2006.01)
*H10D 30/67* (2025.01)
(52) U.S. Cl.
CPC ..... *H10D 30/6713* (2025.01); *H10D 30/6735* (2025.01); *H10D 30/6757* (2025.01)
(58) Field of Classification Search
CPC ......... H01L 29/78618; H01L 29/42392; H01L 29/78696; H01L 21/823864; H01L 21/823814; H01L 21/823821; H01L 21/823871; H01L 27/092; H01L 27/0924; H01L 29/1079; H01L 29/165; H01L 29/7848; H01L 29/0673; H01L 29/0847; H01L 29/41766; H01L 29/66439; H01L 29/42376; H01L 29/66545; H01L 29/775; H01L 29/7845; H01L 21/28518; H01L 21/76843; H01L 21/823807; B82Y 10/00
See application file for complete search history.

(56) References Cited

U.S. PATENT DOCUMENTS

| 6,326,270 B1 | 12/2001 | Lee et al. |
| 10,147,650 B2 | 12/2018 | Kim et al. |
| 10,998,241 B2 | 5/2021 | Khaderbad et al. |
| 2010/0123198 A1 | 5/2010 | Kim et al. |

(Continued)

FOREIGN PATENT DOCUMENTS

| KR | 10-0284905 B1 | 4/2001 |
| KR | 10-2014-0137995 A | 12/2014 |

(Continued)

*Primary Examiner* — Karen Kusumakar
(74) *Attorney, Agent, or Firm* — Muir Patent Law, PLLC

(57) ABSTRACT

A semiconductor device may include first and second active regions on a substrate, first and second active patterns on the first and second active regions, first and second source/drain patterns on the first and second active patterns, first and second silicide patterns on the first and second source/drain patterns, and first and second active contacts coupled to the first and second source/drain patterns. A lowermost portion of the first active contact is at a level higher than that of a lowermost portion of the second active contact. A thickness of the first silicide pattern is greater than that of the second silicide pattern.

20 Claims, 37 Drawing Sheets

(56) References Cited

U.S. PATENT DOCUMENTS

| | | |
|---|---|---|
| 2012/0171826 A1 | 7/2012 | Kim et al. |
| 2014/0346608 A1* | 11/2014 | Kim .................. H01L 29/78 |
| | | 257/369 |
| 2021/0035976 A1 | 2/2021 | Gwon et al. |
| 2021/0066100 A1 | 3/2021 | Liaw |
| 2021/0066506 A1 | 3/2021 | Liaw |
| 2021/0265464 A1* | 8/2021 | Fung ................... H01L 29/775 |

FOREIGN PATENT DOCUMENTS

| | | |
|---|---|---|
| KR | 10-1561059 B1 | 10/2015 |
| KR | 10-2017-0009191 A | 1/2017 |
| KR | 10-1757748 B1 | 7/2017 |
| KR | 10-2021-0013811 A | 2/2021 |

* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2021-0130652, filed on Oct. 1, 2021, in the Korean Intellectual Property Office, the disclosure of which is hereby incorporated by reference in its entirety.

BACKGROUND

1. Field

The present disclosure relates to a semiconductor device, and more particularly, to a semiconductor device including a field effect transistor.

2. Description of the Related Art

A semiconductor device may include an integrated circuit with metal oxide semiconductor field effect transistors (MOSFETs). As sizes and design rules of the semiconductor device are gradually decreased, sizes of MOSFETs are also increasingly scaled down. The scale down of MOSFETs may deteriorate operating characteristics of the semiconductor device. Accordingly, various studies have been conducted to develop methods of fabricating semiconductor devices having superior performance while overcoming issues associated with high integration of the semiconductor devices.

SUMMARY

According to some embodiments, a semiconductor device may include a first active region and a second active region that are adjacent to each other on a substrate; a first active pattern and a second active pattern that are on the first active region and the second active region, respectively; a first source/drain pattern and a second source/drain pattern that are on the first active pattern and the second active pattern, respectively; a first silicide pattern and a second silicide pattern that are on the first source/drain pattern and the second source/drain pattern, respectively; and a first active contact and a second active contact that are coupled to the first source/drain pattern and the second active pattern, respectively. A lowermost portion of the first active contact may be at a level higher than a level of a lowermost portion of the second active contact. A thickness of the first silicide pattern may be greater than a thickness of the second silicide pattern.

According to some embodiments, a semiconductor device may include a first active pattern and a second active pattern that are adjacent to each other in a first direction on a substrate; a gate electrode that extends in the first direction to run across the first and second active patterns; a first recess and a second recess that are on an upper portion of the first active pattern and an upper portion of the second active pattern, respectively; a first source/drain pattern and a second source/drain pattern that fill a portion of the first recess and a portion of the second recess, respectively; a first active contact and a second active contact that are coupled to the first source/drain pattern and the second active pattern, respectively; a first silicide pattern between the first source/drain pattern and the first active contact; and a second silicide pattern between the second source/drain pattern and the second active contact. The first active contact may be in contact with a top surface of the first silicide pattern. The second active contact may include a first extension part that extends into the second recess to contact an inner sidewall of the second silicide pattern.

According to some embodiments, a semiconductor device may include a substrate including a first active region and a second active region that are adjacent to each other in a first direction; a first active pattern and a second active pattern that are on the first active region and the second active region, respectively; a first source/drain pattern on the first active pattern and a second source/drain pattern on the second active pattern; a first silicide pattern on the first source/drain pattern and a second silicide pattern on the second source/drain pattern; a first channel pattern connected to the first source/drain pattern and a second channel pattern connected to the second source/drain pattern, each of the first and second channel patterns including a first semiconductor pattern, a second semiconductor pattern, and a third semiconductor pattern that are sequentially stacked and spaced apart from each other; a gate electrode that extends in the first direction and runs across the first and second channel patterns, the gate electrode including a first part between the substrate and the first semiconductor pattern, a second part between the first semiconductor pattern and the second semiconductor pattern, a third part between the second semiconductor pattern and the third semiconductor pattern, and a fourth part on the third semiconductor pattern; a gate dielectric layer between the first channel pattern and the gate electrode and between the second channel pattern and the gate electrode; a gate spacer on sidewalls of the gate electrode; a gate capping pattern on a top surface of the gate electrode; a first interlayer dielectric layer on the gate capping pattern; a first active contact and a second active contact that penetrate the first interlayer dielectric layer and are respectively coupled to the first source/drain pattern and the second source/drain pattern; a gate contact that penetrates the first interlayer dielectric layer and is coupled to the gate electrode; a second interlayer dielectric layer on the first interlayer dielectric layer; a first metal layer in the second interlayer dielectric layer, the first metal layer including a plurality of lower lines that are correspondingly electrically connected to the gate contact and the first and second active contacts; a third interlayer dielectric layer on the second interlayer dielectric layer; and a second metal layer in the third interlayer dielectric layer. The second metal layer may include a plurality of upper lines that are correspondingly electrically connected to the lower lines. A lowermost portion of the first active contact may be at a level higher than a level of a lowermost portion of the second active contact. A thickness of the first silicide pattern may be greater than a thickness of the second silicide pattern.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
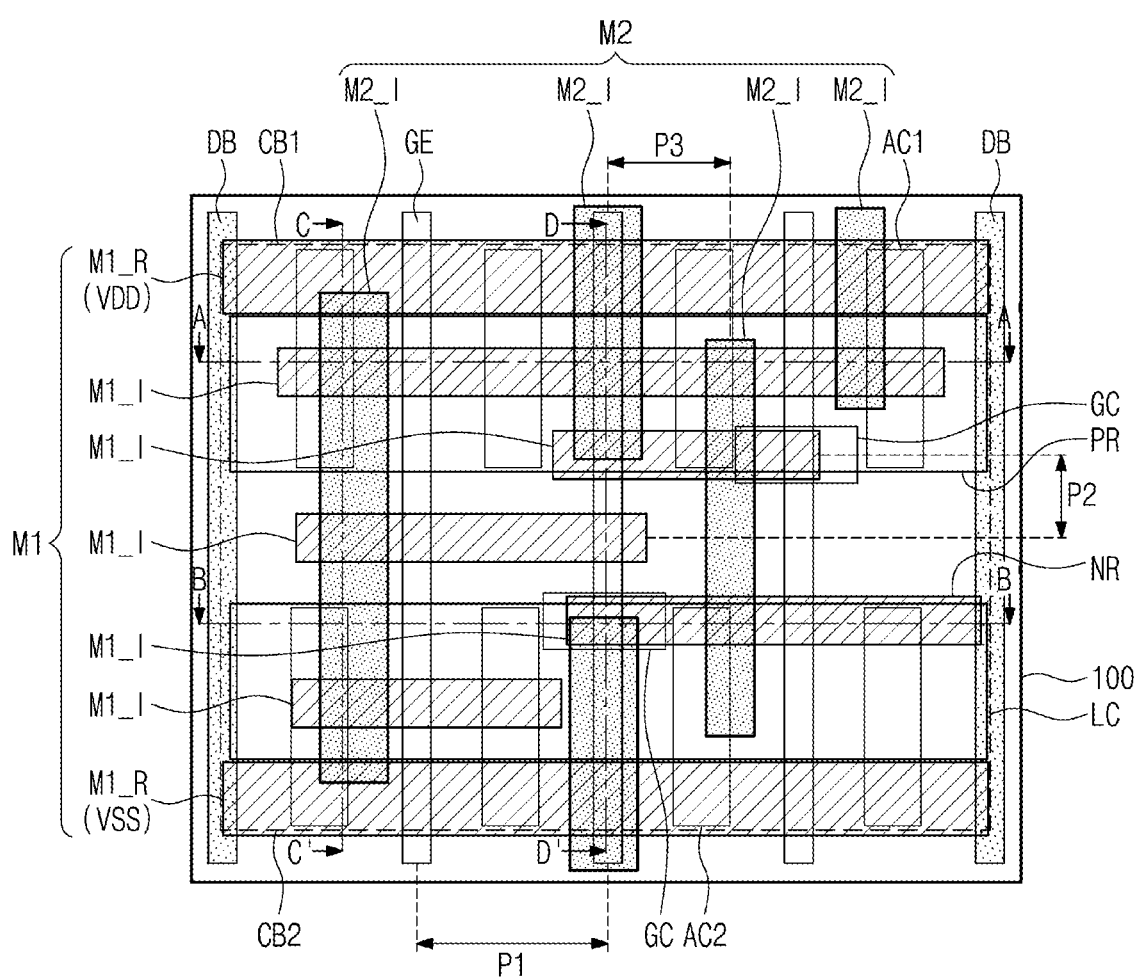
FIG. 1 illustrates a plan view showing a semiconductor device according to some embodiments.
Figure 2A:
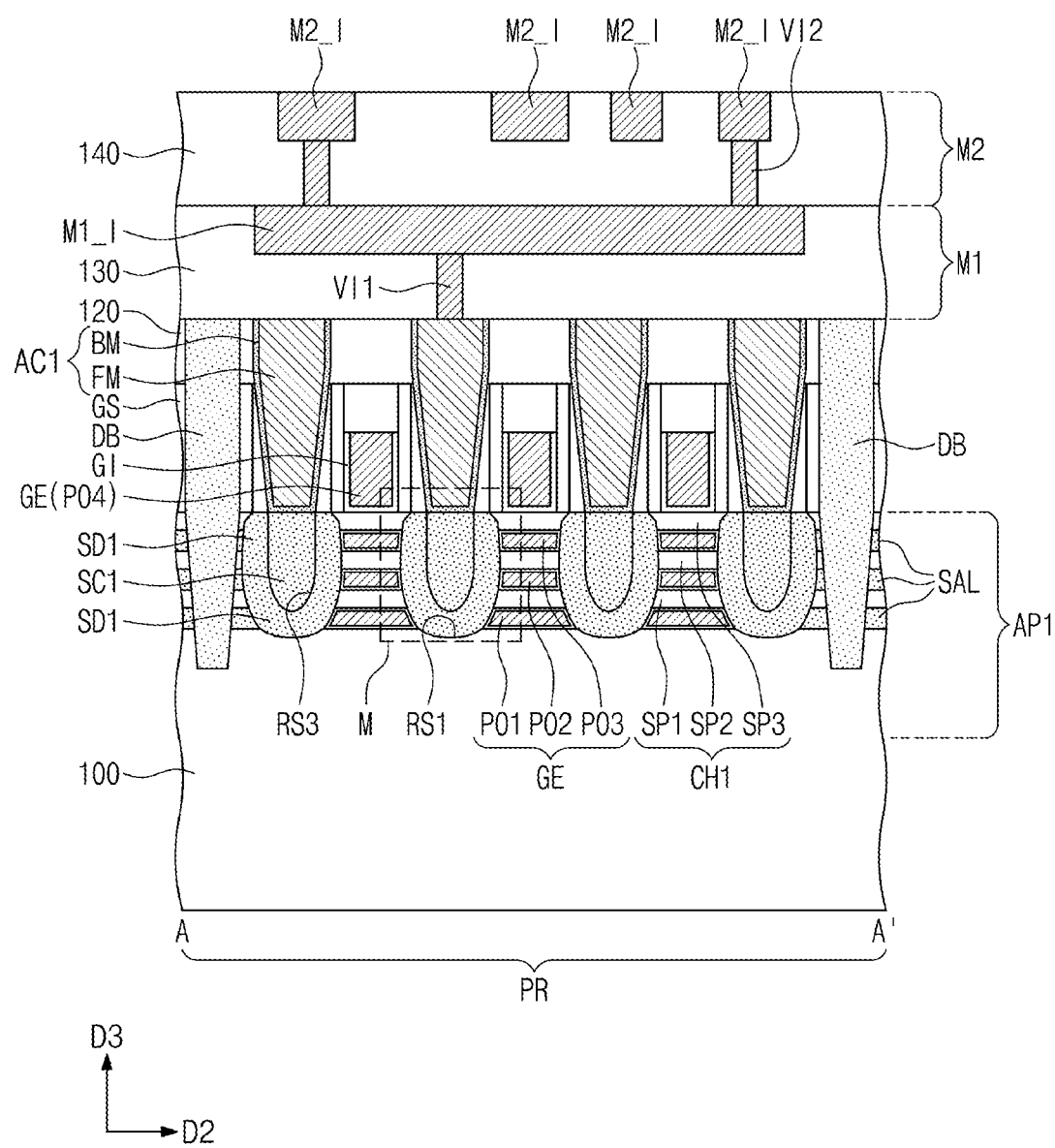
FIGS. 2A, 2B, 2C, and 2D illustrate cross-sectional views respectively taken along lines A-A', B-B', C-C', and D-D' of FIG. 1.
Figure 2B:
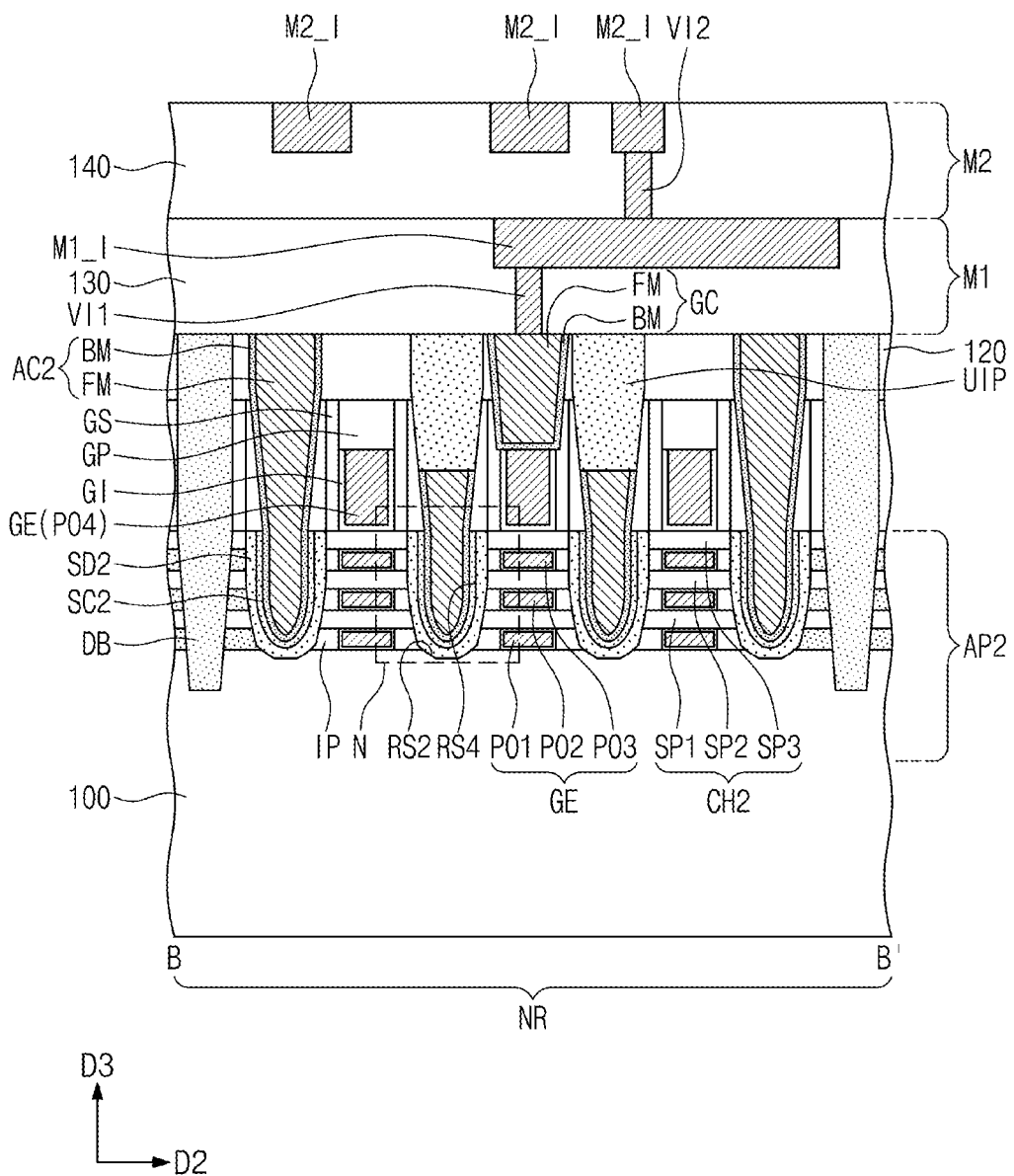
Figure 3:
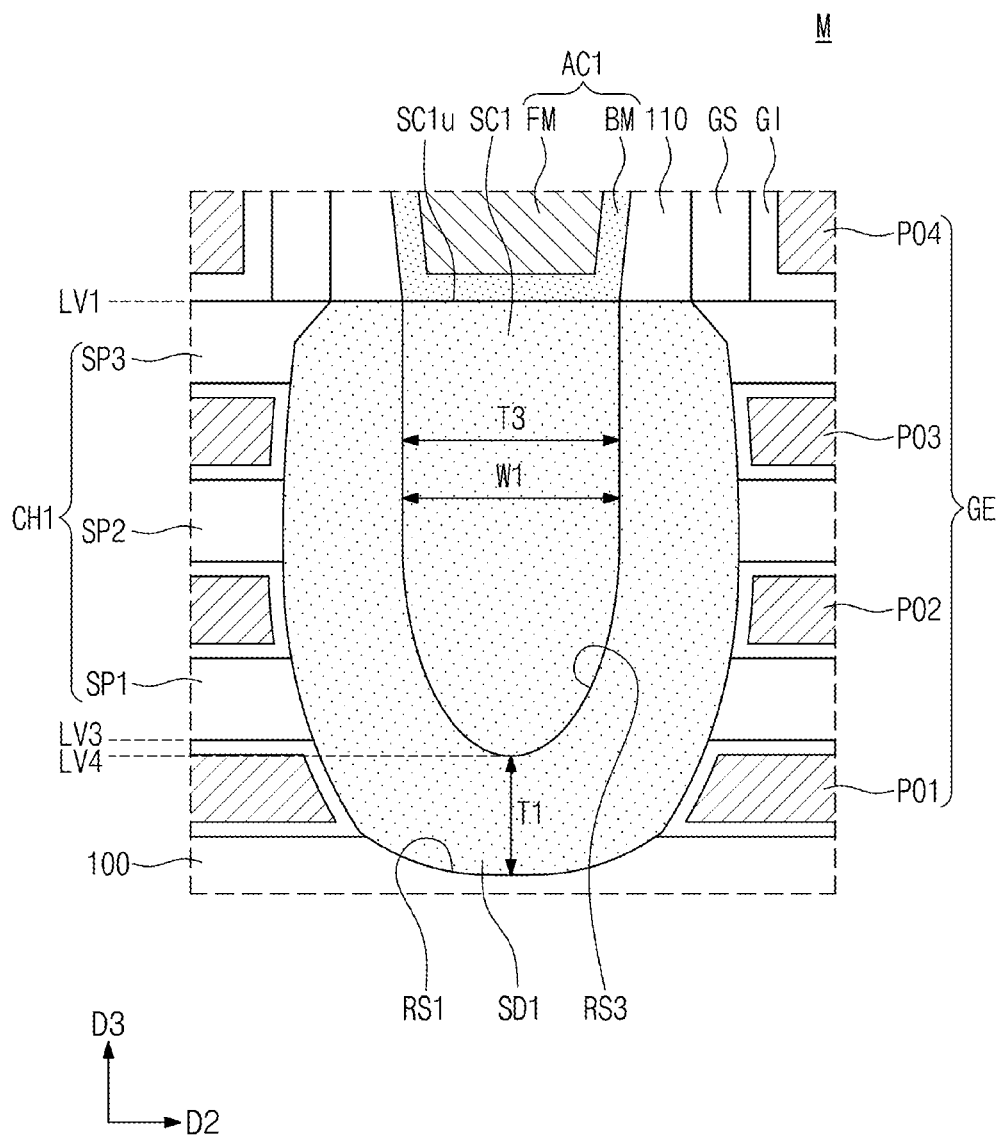
FIG. 3 illustrates an enlarged cross-sectional view of section M in FIG. 2A.
Figure 4:
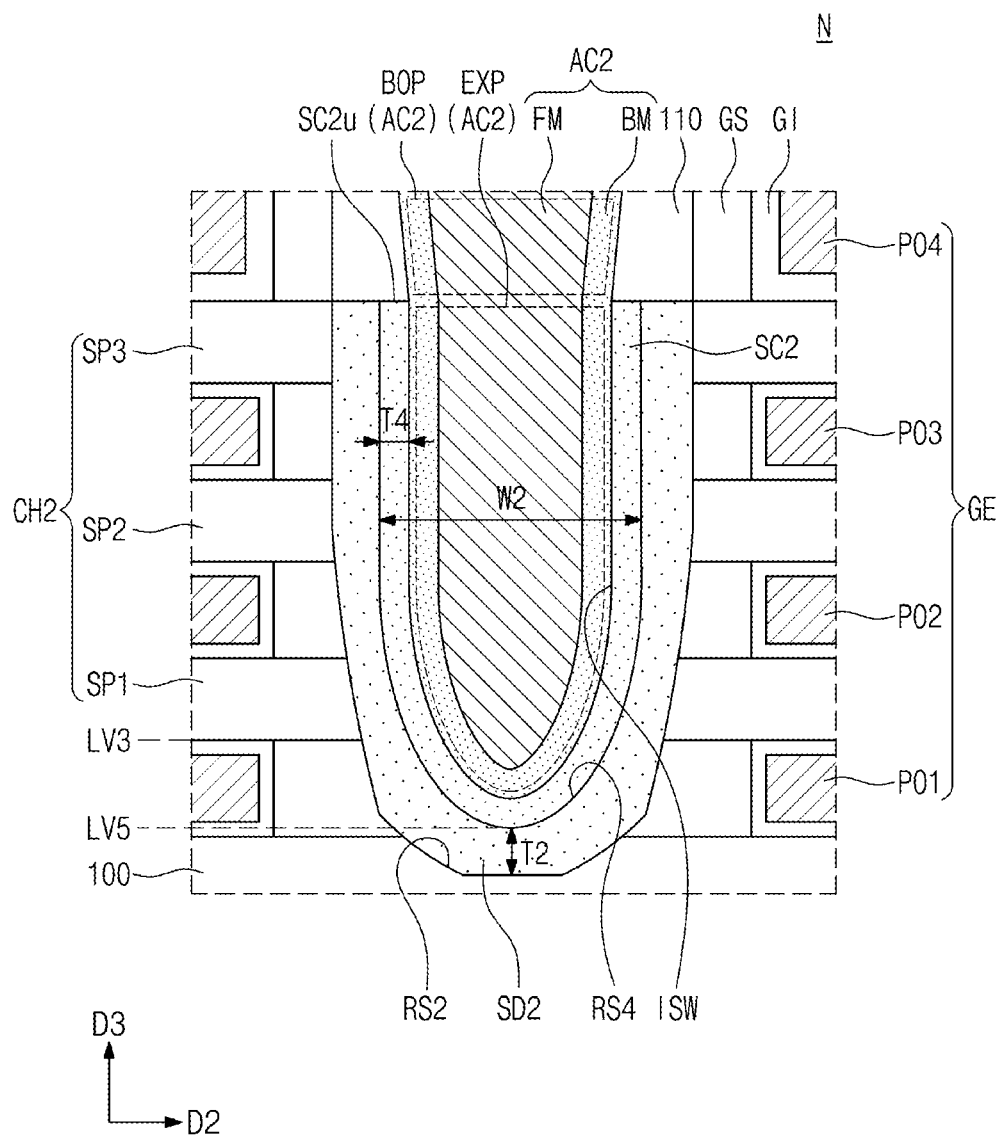
FIG. 4 illustrates an enlarged cross-sectional view of section N in FIG. 2B.

FIG. 1 illustrates a plan view showing a semiconductor device according to some embodiments. FIGS. 2A, 2B, 2C, and 2D illustrate cross-sectional views respectively taken along lines A-A', B-B', C-C', and D-D' of FIG. 1. FIG. 3 illustrates an enlarged cross-sectional view of section M in FIG. 2A, and FIG. 4 illustrates an enlarged cross-sectional view of section N in FIG. 2B.

Referring to FIGS. 1 and 2A to 2D, a logic cell LC may be provided on a substrate 100. The logic cell LC may include logic transistors included in a logic circuit. The substrate 100 may be a compound semiconductor substrate or a semiconductor substrate including, e.g., silicon, germanium, or silicon-germanium. For example, the substrate 100 may be a silicon substrate.

The logic cell LC may include a first active region PR and a second active region NR. The first active region PR and the second active region NR may be defined by a second trench TR2 formed on an upper portion of the substrate 100. For example, the second trench TR2 may be positioned between the first active region PR and the second active region NR. The first active region PR and the second active region NR may be spaced apart from each other in a first direction D1 across the second trench TR2. For example, the first active region PR may be a PMOSFET region, and the second active region NR may be an NMOSFET region.

A first trench TR1 formed on the upper portion of the substrate 100 may define a first active pattern AP1 and a second active pattern AP2. The first active pattern AP1 and the second active pattern AP2 may be respectively provided on the first active region PR and the second active region NR. The first trench TR1 may be shallower than the second trench TR2. The first and second active patterns AP1 and AP2 may extend in a second direction D2. The first and second active patterns AP1 and AP2 may be vertically protruding portions of the substrate 100.

A device isolation layer ST may fill the first and second trenches TR1 and TR2. The device isolation layer ST may include, e.g., a silicon oxide layer. The first and second active patterns AP1 and AP2 may have their upper portions that vertically protrude upwards from the device isolation layer ST (see FIG. 2D). The device isolation layer ST may not cover any of the upper portions of the first and second active patterns AP1 and AP2. The device isolation layer ST may cover lower sidewalls of the first and second active patterns AP1 and AP2.

The first active pattern AP1 may include a first channel pattern CH1 on an upper portion thereof. The second active pattern AP2 may include a second channel pattern CH2 on an upper portion thereof. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction or a third direction D3.

Each of the first, second, and third semiconductor patterns SP1, SP2, and SP3 may include, e.g., silicon (Si), germanium (Ge), or silicon-germanium (SiGe). For example, each of the first, second, and third semiconductor patterns SP1, SP2, and SP3 may include crystalline silicon.

A plurality of first recesses RS1 may be formed on the upper portion of the first active pattern AP1. First source/drain patterns SD1 may be provided in corresponding first recesses RS1. The first source/drain patterns SD1 may partially fill the first recesses RS1 (FIG. 2A). The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second recesses RS2 may be formed on the upper portion of the second active pattern AP2. Second source/drain patterns SD2 may be provided in corresponding second recesses RS2. The second source/drain patterns SD2 may partially fill the second recesses RS2 (FIG. 2B). The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth process. For example, each of the first and second source/drain patterns SD1 and SD2 may have an uppermost surface located at substantially the same level as that of a top surface of the third semiconductor pattern SP3, e.g., uppermost surfaces of the first and second source/drain patterns SD1 and SD2 may be coplanar with the top surface of the third semiconductor pattern SP3. In another example, each of the first and second source/drain patterns SD1 and SD2 may have an uppermost surface located at a higher level than that of a top surface of the third semiconductor pattern SP3, e.g., relative to a bottom of the substrate 100.

The first source/drain patterns SD1 may include a semiconductor element (e.g., SiGe) whose lattice constant is greater than that of a semiconductor element of the substrate 100. Therefore, a pair of the first source/drain patterns SD1 may provide the first channel pattern CH1 with compressive stress. The second source/drain patterns SD2 may include the same semiconductor element (e.g., Si) as that of the substrate 100.

Gate electrodes GE may be provided to extend in the first direction D1, while running across the first and second active patterns AP1 and AP2. The gate electrodes GE may be arranged at a first pitch P1 in the second direction D2. Each of the gate electrodes GE may vertically overlap the first and second channel patterns CH1 and CH2.

The gate electrode GE may include a first part PO1 interposed between the substrate 100 and the first semiconductor pattern SP1, a second part PO2 interposed between the first semiconductor pattern SP1 and the second semiconductor pattern SP2, a third part PO3 interposed between the second semiconductor pattern SP2 and the third semiconductor pattern SP3, and a fourth part PO4 on the third semiconductor pattern SP3.

Referring back to FIG. 2A, different widths may be given to the first, second, and third parts PO1, PO2, and PO3 of the gate electrode GE on the first active region PR, e.g., in the second direction D2. For example, a maximum width in the second direction D2 of the third part PO3 may be greater than a maximum width in the second direction D2 of the second part PO2. A maximum width in the second direction D2 of the first part PO1 may be greater than the maximum width in the second direction D2 of the third part PO3.

Referring back to FIG. 2D, the gate electrode GE may be provided on a top surface TS, a bottom surface BS, and opposite sidewalls SW of each of the first, second, and third semiconductor patterns SP1, SP2, and SP3. For example, a transistor according to the present embodiment may be a three-dimensional field effect transistor (e.g., multi-bridge channel field effect transistor (MBCFET) or a gate all around field effect transistor (GAAFET)) in which the gate electrode GE three-dimensionally surrounds the first and second channel patterns CH1 and CH2.

Referring back to FIGS. 1 and 2A to 2D, a pair of gate spacers GS may be disposed on opposite sidewalls of the fourth part PO4 of the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. The gate spacers GS may include at least one of, e.g., SiCN, SiCON, and SiN. Alternatively, the gate spacers GS may each include a multiple layer formed of at least two of, e.g., SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one of, e.g., SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3. The gate dielectric layer GI may cover the top surface of the device isolation layer ST below the gate electrode GE (see FIG. 2D).

In some embodiments, the gate dielectric layer GI may include one or more of, e.g., a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Alternatively, a semiconductor device according to embodiments may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance. The paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 m V/decade at room temperature.

The ferroelectric material layer may have ferroelectric properties. The ferroelectric material layer may include, e.g., one or more of hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include one or more of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include impurities, e.g., at least one of gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, e.g., at least one of silicon oxide and high-k metal oxide. The metal oxide included in the paraelectric material layer may include, e.g., at least one of hafnium oxide, zirconium oxide, and aluminum oxide.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, e.g., from about 0.5 nm to about 10 nm. Because ferroelectric materials have their own critical thickness that exhibits ferroelectric properties, the thickness of the ferroelectric material layer may depend on ferroelectric material.

For example, the gate dielectric layer GI may include a single ferroelectric material layer. In another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third parts PO1, PO2, and PO3 of the gate electrode GE may be formed of the first metal pattern or a work-function metal.

The first metal pattern may include a metal nitride layer. For example, the first metal pattern may include nitrogen (N) and at least one metal of, e.g., titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal of tungsten (W), aluminum (Al), titanium (Ti), and tantalum (Ta). For example, the fourth part PO4 of the gate electrode GE may include a first metal pattern and a second metal pattern on the first metal pattern.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. For example, the first and second interlayer dielectric layers 110 and 120 may include a silicon oxide layer.

The logic cell LC may have, on opposite sides thereof, a pair of separation structures DB that are opposite to each other in the second direction D2. The separation structure DB may extend in the first direction D1 parallel to the gate electrodes GE. The separation structure DB and its adjacent gate electrode GE may be arranged at a same pitch as the first pitch P1.

The separation structure DB may penetrate the first and second interlayer dielectric layers 110 and 120 to extend into the first and second active patterns AP1 and AP2. The separation structure DB may penetrate the upper portion of each of the first and second active patterns AP1 and AP2. The separation structure DB may separate the first and second active regions PR and NR of the logic cell LC from first and second active regions of an adjacent logic cell.

Each of the first and second active patterns AP1 and AP2 may include, on its upper portion, sacrificial layers SAL adjacent to the separation structure DB. The sacrificial layers SAL may be stacked and spaced apart from each other. The sacrificial layer SAL may be located at the same level as that of a corresponding one of the first, second, and third parts PO1, PO2, and PO3. The separation structure DB may penetrate the sacrificial layers SAL.

Referring back to FIG. 2B, inner spacers IP may be provided on the second active region NR. The inner spacers IP may be correspondingly interposed between the second source/drain pattern SD2 and the first, second, and third parts PO1, PO2, and PO3 of the gate electrode GE. The inner spacers IP may be in direct contact with the second source/drain pattern SD2. The inner spacer IP may separate the second source/drain pattern SD2 from each of the first, second, and third parts PO1, PO2, and PO3 of the gate electrode GE.

A first active contact AC1 may be provided to penetrate the first and second interlayer dielectric layers 110 and 120 and to electrically connect with the first source/drain pattern SD1. A second active contact AC2 may be provided to penetrate the first and second interlayer dielectric layers 110 and 120 and to electrically connect with the second source/drain pattern SD2.

A pair of first active contacts AC1 may be provided on opposite sides of the gate electrode GE on the first active region PR. A pair of second active contacts AC2 may be provided on opposite sides of the gate electrode GE on the second active region NR. When viewed in plan, each of the first and second active contacts AC1 and AC2 may have a bar shape that extends in the first direction D1. The first and second active contacts AC1 and AC2 may each be a self-aligned contact. For example, the gate capping pattern GP and the gate spacer GS may be used to form the first and second active contacts AC1 and AC2 in a self-alignment manner. For example, each of the first and second active contacts AC1 and AC2 may cover at least a portion of a sidewall of the gate spacer GS. Although not shown, each of the first and second active contacts AC1 and AC2 may cover a portion of the top surface of the gate capping pattern GP.

Figure 2C:
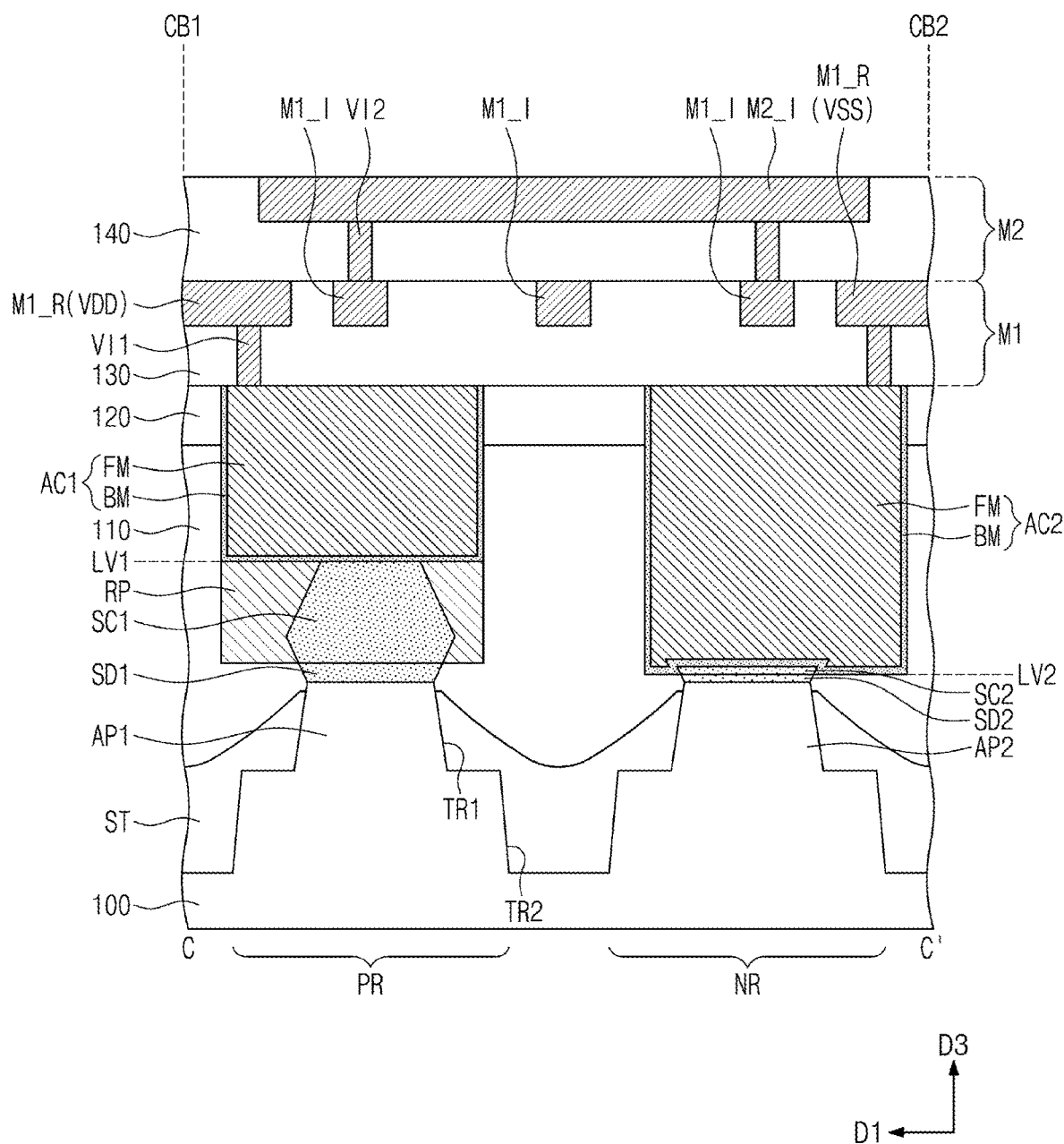

A residual pattern RP may be provided on the first source/drain pattern SD1, as illustrated in FIG. 2C. The residual pattern RP may be adjacent in the first direction D1 to a first silicide pattern SC1 which will be discussed below. The residual pattern RP may be provided between the first silicide pattern SC1 and the first interlayer dielectric layer 110. The residual pattern RP may be in contact with a bottom surface of the first active contact AC1. The residual pattern RP may include, e.g., at least one of titanium, tantalum, tungsten, nickel, and cobalt. The second active contact AC2 may cover a top surface and a sidewall of a second silicide pattern SC2 which will be discussed below. For example, the top surface and the sidewall of the second silicide pattern SC2 may be covered with a barrier pattern BM of the second active contact AC2 which will be discussed below.

A lowermost portion of the first active contact AC1 may be located at a first level LV1. A lowermost portion of the second active contact AC2 may be located at a second level LV2. The first level LV1 may be higher than the second level LV2, e.g., relative to a bottom of the substrate 100 (see FIG. 2C).

The first silicide pattern SC1 may be provided between the first active contact AC1 and the first source/drain pattern SD1. The second silicide pattern SC2 may be provided between the second active contact AC2 and the second source/drain pattern SD2. The first active contact AC1 may be electrically connected through the first silicide pattern SC1 to the first source/drain pattern SD1. The second active contact AC2 may be electrically connected through the second silicide pattern SC2 to the second source/drain pattern SD2. The first and second silicide patterns SC1 and SC2 may include metal silicide, e.g., at least one of titanium silicide, tantalum silicide, tungsten silicide, nickel silicide, and cobalt silicide.

A third recess RS3 may be provided on the upper portion of the first source/drain pattern SD1 (FIG. 2A). The first silicide pattern SC1 may be provided in the third recess RS3. A fourth recess RS4 may be provided on the upper portion of the second source/drain pattern SD2 (FIG. 2B). The second silicide pattern SC2 may be provided in the fourth recess RS4. The first silicide pattern SC1 may completely fill the third recess RS3. The second silicide pattern SC2 may partially fill the fourth recess RS4. The second silicide pattern SC2 may be conformally formed along an inner sidewall of the fourth recess RS4. For example, the second silicide pattern SC2 may be shaped like U.

Figure 2D:
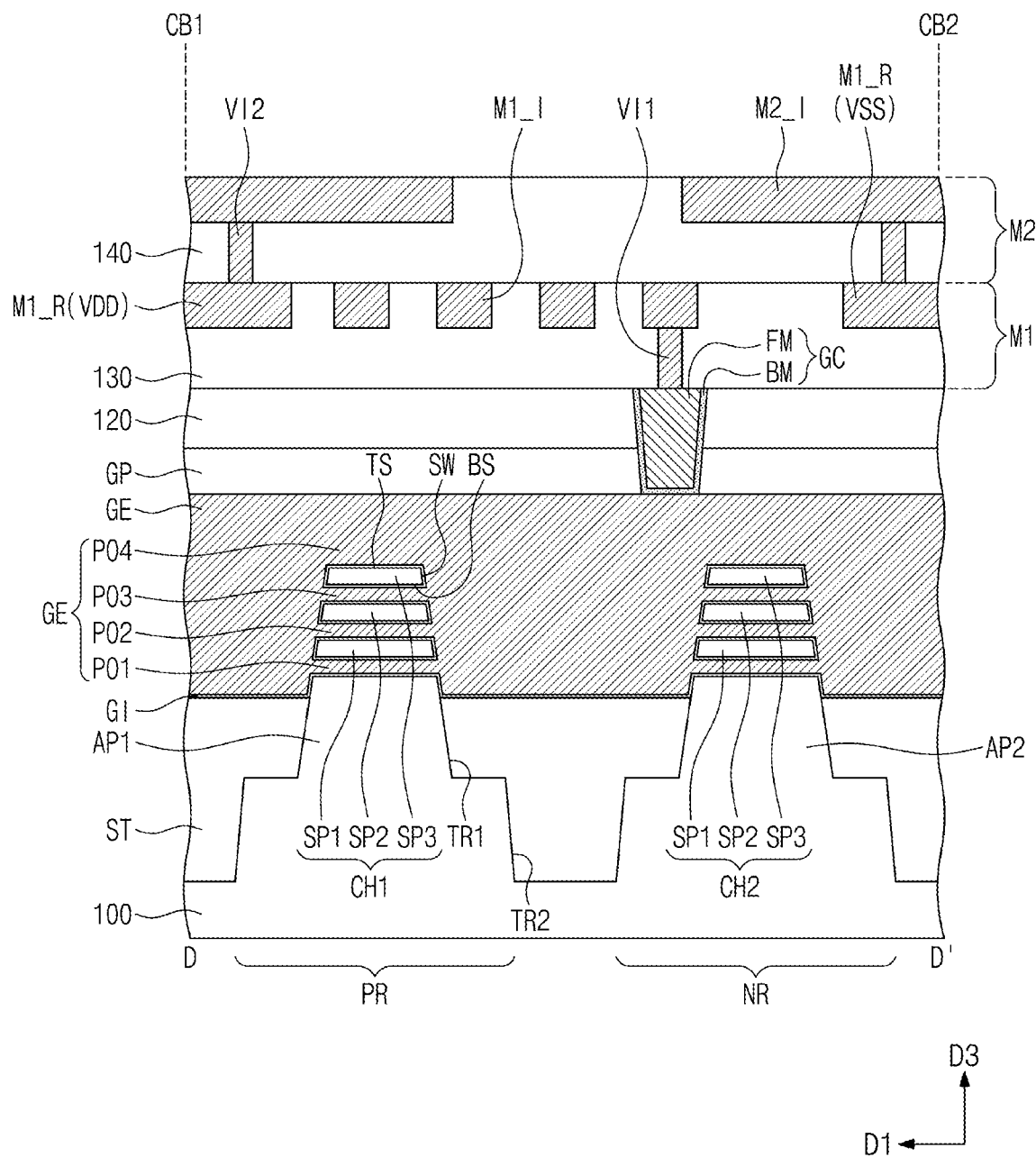

A gate contact GC may be provided to penetrate the second interlayer dielectric layer 120 and the gate capping pattern GP and to electrically connect with the gate electrode GE (FIG. 2D). For example, referring to FIG. 2B, an upper dielectric pattern UIP may fill an upper portion of each of the second active contacts AC2 adjacent to the gate contact GC. Therefore, it may be possible to prevent process failure caused by short-circuits resulting from contact between the gate contact GC and its adjacent second active contact AC2. Although not shown, an upper dielectric pattern UIP may fill the upper portion of the first active contact AC1.

The gate contact GC and the first and second active contacts AC1 and AC2 may each include a conductive pattern FM and a barrier pattern BM that surrounds the conductive pattern FM. For example, the conductive pattern FM may include at least one of aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one of titanium, tantalum, tungsten, nickel, cobalt, and platinum. The metal nitride layer may include at least one of a titanium nitride (TiN) layer, a tantalum nitride (TaN) layer, a tungsten nitride (WN) layer, a nickel nitride (NiN) layer, a cobalt nitride (CON) layer, and a platinum nitride (PtN) layer.

A first metal layer M1 may be provided in a third interlayer dielectric layer 130. The first metal layer M1 may include first lower lines M1_R, second lower lines M1_I, and lower vias VI1. The lower vias VI1 may be provided below the first and second lower lines M1_R and M1_I.

Each of the first lower lines M1_R may extend in the second direction D2, while running across the logic cell LC. Each of the first lower lines M1_R may be a power line. For example, the first lower line M1_R may be supplied with a drain voltage VDD or a source voltage VSS.

Referring to FIG. 1, the logic cell LC may include a first cell boundary CB1 that extends in the second direction D2. On the logic cell LC, a second cell boundary CB2 may be defined on a location opposite to that on which the first cell boundary CB1 is defined. The first cell boundary CB1 may be provided thereon with the first lower line M1_R which is applied with the drain voltage VDD or a power voltage. The first lower line M1_R, to which the drain voltage VDD is applied, may extend in the second direction D2 along the first cell boundary CB1. The second cell boundary CB2 may be provided thereon with the first lower line M1_R which is applied with the source voltage VSS or a ground voltage. The first lower line M1_R, to which the source voltage VSS is applied, may extend in the second direction D2 along the second cell boundary CB2.

The second lower lines M1_I may be disposed along the first direction D1 between the first lower line M1_R to which the drain voltage VDD is applied and the first lower line M1_R to which the source voltage VSS is applied. Each of the second lower lines M1_I may have a linear or bar shape that extends in the second direction D2. The second lower lines M1_I may be arranged at a second pitch P2 in the first direction D1. The second pitch P2 may be less than the first pitch P1.

The lower vias VI1 may be provided below the first and second lower lines M1_R and M1_I of the first metal layer M1. The lower vias VI1 may be correspondingly interposed between the first and second active contacts AC1 and AC2 and the first and second lower lines M1_R and M1_I. The lower vias VI1 may be correspondingly interposed between the gate contacts GC and the second lower lines M1_I.

The lower line M1_R or M1_I and its underlying lower via VI1 of the first metal layer M1 may be formed by processes that are separate from each other. For example, the lower line M1_R or M1_I and the lower via VI1 may each be formed by a single damascene process. A sub-20 nm process may be employed to fabricate a semiconductor device according to some embodiments.

A second metal layer M2 may be provided in a fourth interlayer dielectric layer 140. The second metal layer M2 may include upper lines M2_I. Each of the upper lines M2_I may have a linear or bar shape that extends in the first direction D1. For example, the upper lines M2_I may parallel extend in the first direction D1. When viewed in plan, the upper lines M2_I may be parallel to the gate electrodes GE. The upper lines M2_I may be arranged at a third pitch P3 along the second direction D2. The third pitch P3 may be less than the first pitch P1. The third pitch P3 may be greater than the second pitch P2.

The second metal layer M2 may further include upper vias VI2. The upper vias VI2 may be provided below the upper lines M2_I. The upper vias VI2 may be correspondingly interposed between the upper lines M2_I and the lower lines M1_R and M1_I.

The upper line M2_I and its underlying upper via VI2 of the second metal layer M2 may be formed into a single piece in the same process. For example, a dual damascene process may be employed to simultaneously form the upper line M2_I and the upper via VI2 of the second metal layer M2.

The lower lines M1_R and M1_I of the first metal layer M1 may include a conductive material the same as or different from that of the upper lines M2_I of the second metal layer M2. For example, the upper lines M2_I and the lower lines M1_R and M1_I may include at least one metallic material of aluminum, copper, tungsten, molybdenum, and cobalt.

In some example embodiments, although not shown, stacked metal layers (e.g., M3, M4, M5, etc.) may be additionally provided on the fourth interlayer dielectric layer 140. Each of the stacked metal layers may include routing lines.

With reference to FIGS. 3 and 4, the following will describe in detail the first and second source/drain patterns SD1 and SD2, the first and second silicide patterns SC1 and SC2, and the first and second active contacts AC1 and AC2.

Referring to FIG. 3, the first recess RS1 may be provided therein with the first source/drain pattern SD1 and the first silicide pattern SC1. For example, the first source/drain pattern SD1 and the first silicide pattern SC1 may completely fill the first recess RS1. The first silicide pattern SC1 may fully fill the third recess RS3 on the upper portion of the first source/drain pattern SD1. The first silicide pattern SC1 may have a curved profile at a bottom end thereof.

The first active contact AC1 may not extend into the first recess RS1. A lowermost portion of the first active contact AC1 may be located at the first level LV1. The first level LV1 may be located at a level substantially the same as that of a top surface of the third semiconductor pattern SP3, a top surface of the first source/drain pattern SD1, and an uppermost surface SC1u of the first silicide pattern SC1. The first active contact AC1 may be in contact with the uppermost surface SC1u of the first silicide pattern SC1. For example, as illustrated in FIG. 3, the first active contact AC1 and the uppermost surface SC1u of the first silicide pattern SC1 may, e.g., completely, cover each other. In another example, the uppermost surface SC1u of the first silicide pattern SC1 may, e.g., only, partially cover a bottom surface of the first active contact AC1.

Referring to FIG. 4, the second active contact AC2 may extend into the second recess RS2. The second active contact AC2 may include an extension part EXP that extends into the second recess RS2 and a body part BOP on the extension part EXP. The extension part EXP of the second active contact AC2 may have a width less than that of the body part BOP of the second active contact AC2.

The second recess RS2 may be provided therein with the second source/drain pattern SD2, the second silicide pattern SC2, and the extension part EXP of the second active contact AC2. The second silicide pattern SC2 and the extension part EXP of the second active contact AC2 may fill the fourth recess RS4 on the upper portion of the second source/drain pattern SD2. The second source/drain pattern SD2 and the second silicide pattern SC2 may partially fill the second recess RS2. The extension part EXP of the second active contact AC2 may be in contact with an inner sidewall ISW of the second silicide pattern SC2. The extension part EXP of the second active contact may have a curved profile at a bottom end thereof.

As illustrated in FIG. 3, the third recess RS3 may have a first width W1. The first width W1 may be defined to refer to a width at a central or upper portion of the third recess RS3. As illustrated in FIG. 4, the fourth recess RS4 may have a second width W2. The second width W2 may be defined to refer to a width at a central or upper portion of the fourth recess RS4. The first width W1 may be less than the second width W2.

Referring to FIGS. 3 and 4, the first source/drain pattern SD1 may have a first thickness T1. The first thickness T1 may be defined to indicate a shortest distance between an inner sidewall of the first recess RS1 and a tangent line at a point on an outer sidewall of the first silicide pattern SC1. The second source/drain pattern SD2 may have a second thickness T2. The second thickness T2 may be defined to indicate a shortest distance between an inner sidewall of the second recess RS2 and a tangent line at a point on an outer sidewall of the second silicide pattern SC2. The first thickness T1 may be greater than the second thickness T2.

The first silicide pattern SC1 may have a third thickness T3, e.g., along the second direction D2. The third thickness T3 may be defined to indicate a thickness a central and upper portion of the first silicide pattern SC1. The second silicide pattern SC2 may have a fourth thickness T4, e.g., along the second direction D2. The third thickness T3 may be greater than the fourth thickness T4. The third thickness T3 may be substantially the same as the first width W1.

According to some embodiments, the first silicide pattern SC1 on the first active region PR or a PMOSFET region may be formed thick to have a large volume, compared to the second silicide pattern SC2 on the second active region NR. The large volume of the first silicide pattern SC1 may effectively provide a compressive stress to the first channel pattern CH1 between a pair of first source/drain patterns SD1. Therefore, hole mobility may be increased to induce an improvement in operating speed of PMOSFETs. As such, a semiconductor device may increase in electrical properties.

A bottom surface of the first semiconductor pattern SP1 may be located at a third level LV3. A lowermost portion of the first silicide pattern SC1 may be located at a fourth level LV4. The third level LV3 may be higher than the fourth level LV4, e.g., relative to a bottom of the substrate 100. Alternatively, the third level LV3 may be substantially the same as the fourth level LV4. A lowermost portion of the second silicide pattern SC2 may be located at a fifth level LV5. The third level LV3 may be higher than the fifth level LV5, e.g., relative to a bottom of the substrate 100. The fourth level LV4 may be higher than the fifth level LV5, e.g., relative to a bottom of the substrate 100.

As the lowermost portion of the first silicide pattern SC1 is located at a lower level than that of the bottom surface of the first semiconductor pattern SP1, the first channel pattern CH1 may be effectively provided with compressive stress. As such, a semiconductor device may increase in electrical properties.

FIGS. 5A to 10D illustrate cross-sectional views of stages in a method of fabricating a semiconductor device according to some embodiments. In detail, FIGS. 5A, 6A, 7A, 8A, 9A, and 10A illustrate cross-sectional views taken along line A-A' of FIG. 1, FIGS. 7B, 8B, 9B, and 10B illustrate cross-sectional views taken along line B-B' of FIG. 1, FIGS. 7C, 8C, 9C, and 10C illustrate cross-sectional views taken along line C-C' of FIG. 1, and FIGS. 5B, 6B, 7D, 8D, 9D, and 10D illustrate cross-sectional views taken along line D-D' of FIG. 1.

Figure 5A:
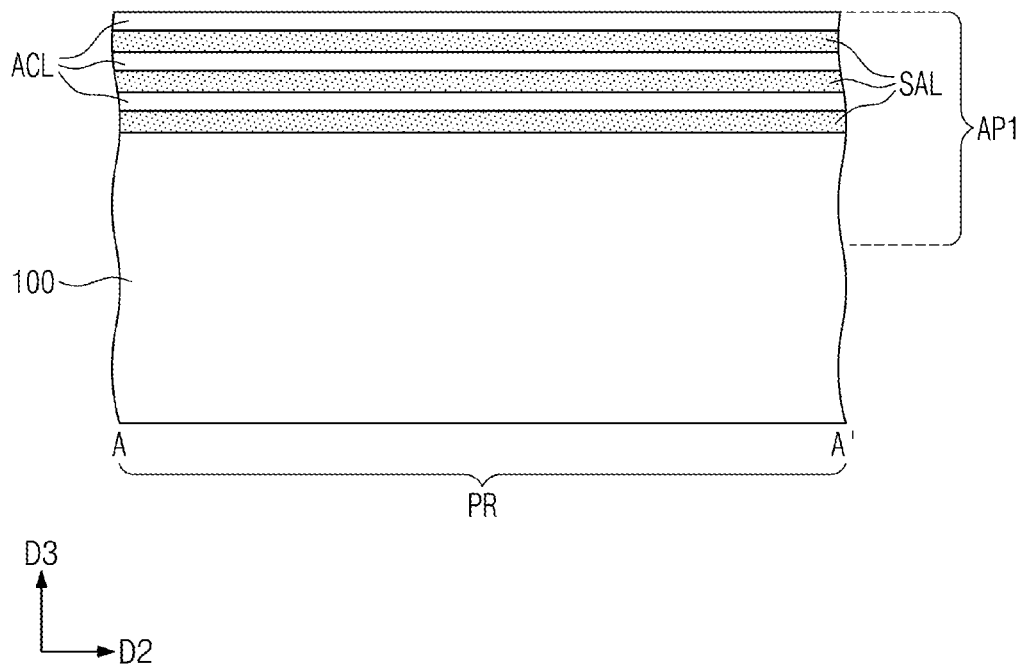
FIGS. 5A to 10D illustrate cross-sectional views showing stages in a method of fabricating a semiconductor device according to some embodiments.
Figure 5B:
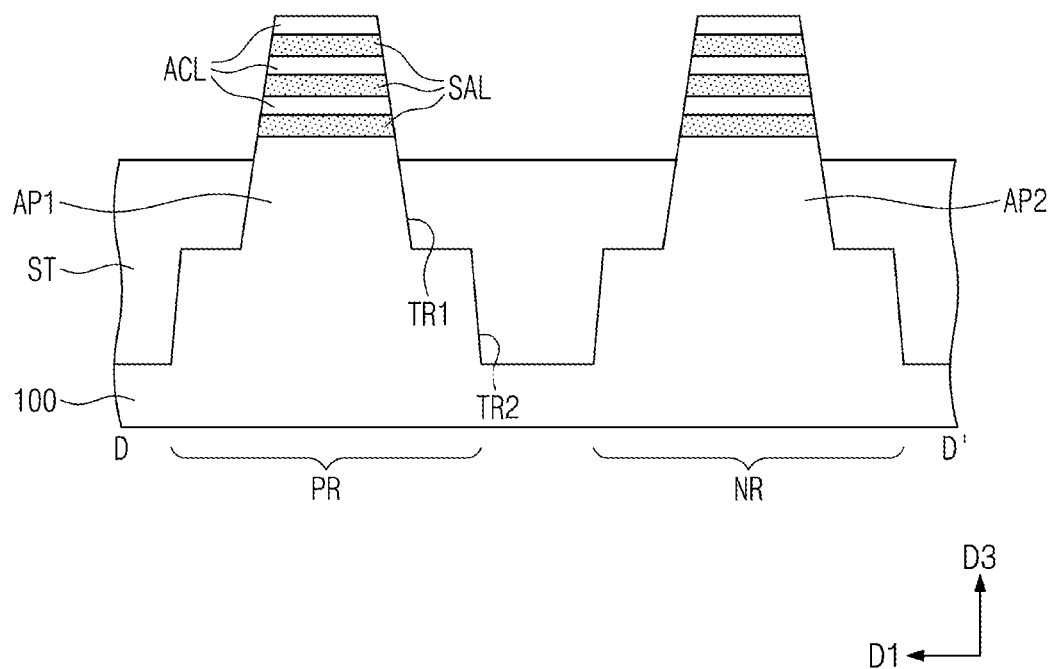

Referring to FIGS. 5A and 5B, the substrate 100 may be provided with the first active region PR and the second active region NR. The sacrificial layers SAL and active layers ACL may be alternately formed and stacked on the substrate 100.

The sacrificial layers SAL may include one of silicon (Si), germanium (Ge), and silicon-germanium (SiGe), and the active layers ACL may include another of silicon (Si), germanium (Ge), and silicon-germanium (SiGe). For example, the sacrificial layers SAL may include silicon-germanium (SiGe), and the active layers ACL may include silicon (Si).

Mask patterns may be formed on the first active region PR and the second active region NR of the substrate 100. The mask patterns may have a linear or bar shape that extends in the second direction D2.

A first patterning process may be performed in which the mask patterns are used as an etching mask to form the first trench TR1 that defines het first active pattern AP1 and the second active pattern AP2. The first active pattern AP1 and the second active pattern AP2 may be respectively formed on the first active region PR and the second active region NR. Each of the first and second active patterns AP1 and AP2 may include the sacrificial layers SAL and the active layers ACL that are alternately stacked on an upper portion thereof.

The substrate 100 may undergo a second patterning process to form the second trench TR2 that defines the first active region PR and the second active region NR. The second trench TR2 may be formed deeper than the first trench TR1. The device isolation layer ST may be formed on the substrate 100, filling the first and second trenches TR1 and TR2. For example, on the substrate 100, a dielectric layer may be formed to cover the first and second active patterns AP1 and AP2. The dielectric layer may be recessed until the sacrificial layers SAL are exposed, and thus the device isolation layer ST may be formed.

The device isolation layer ST may include a dielectric material, e.g., a silicon oxide layer. Each of the first and second active patterns AP1 and AP2 may have an upper portion that is exposed above the device isolation layer ST. For example, the upper portion of each of the first and second active patterns AP1 and AP2 may vertically protrude upward from the device isolation layer ST.

Figure 6A:
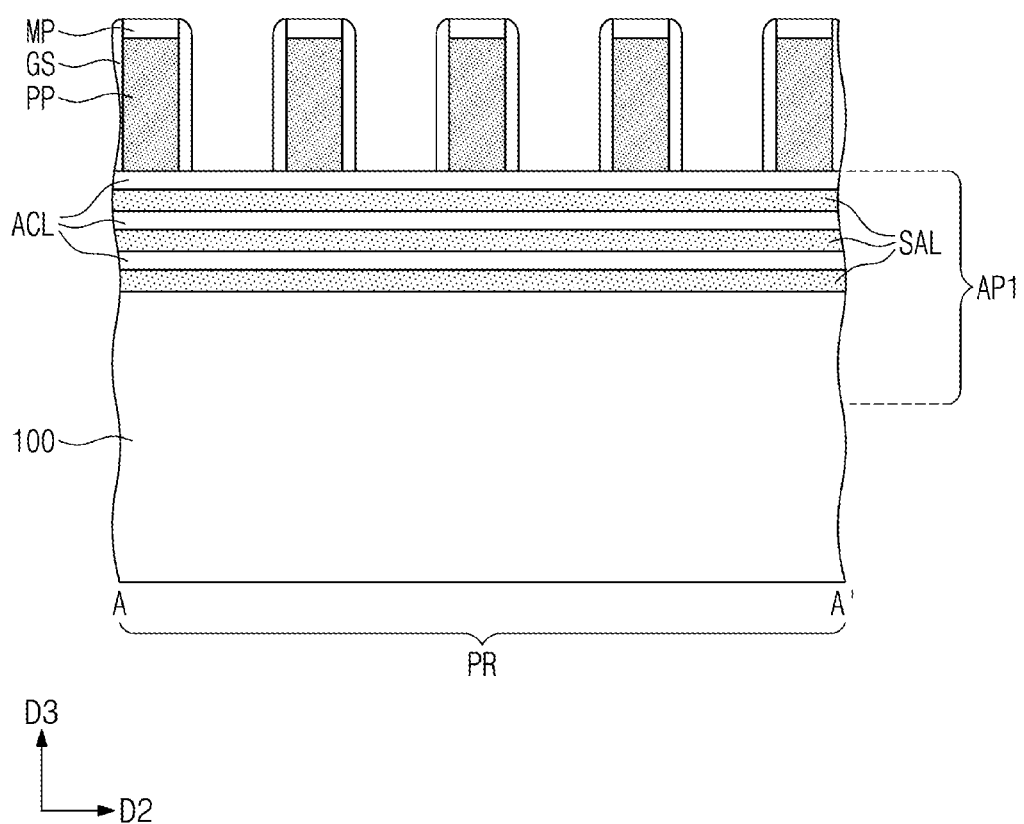
Figure 6B:
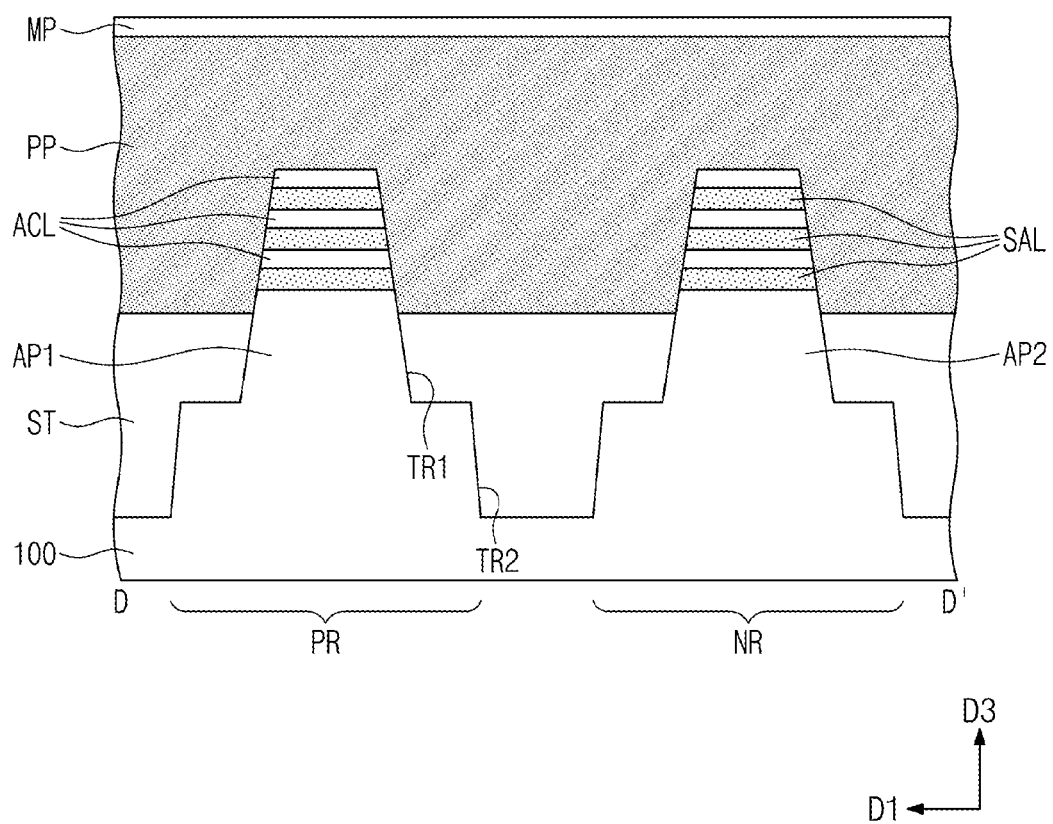
Figure 7A:
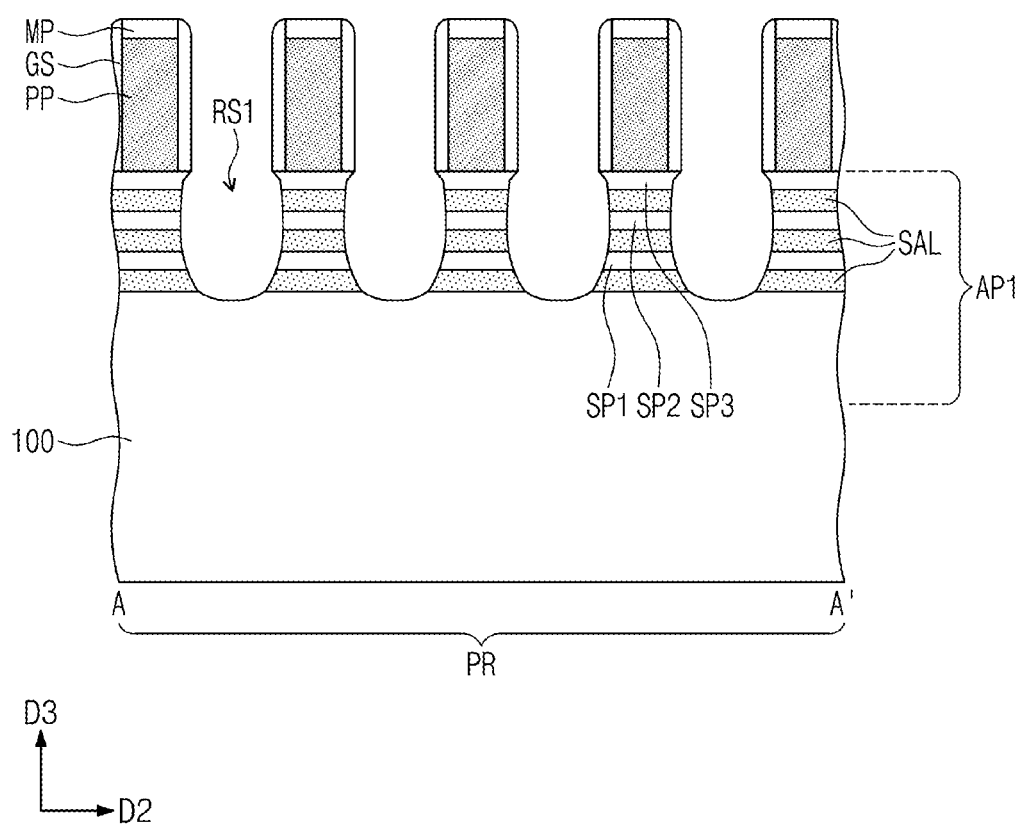
Figure 7B:
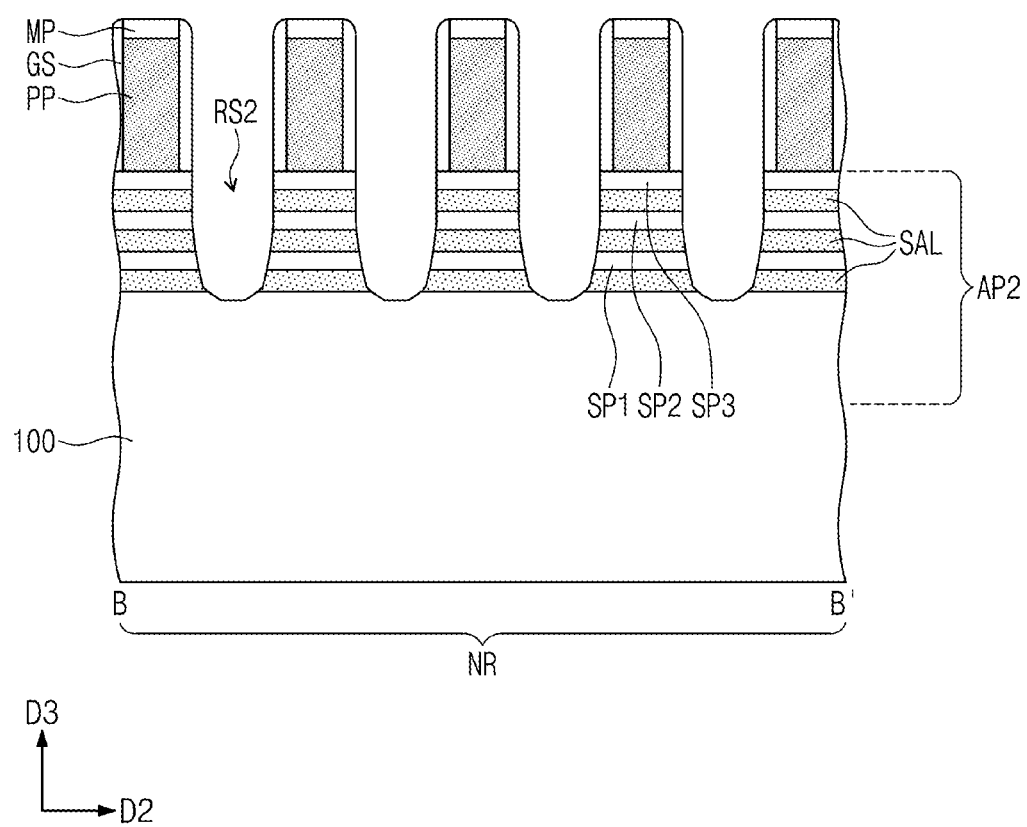
Figure 7C:
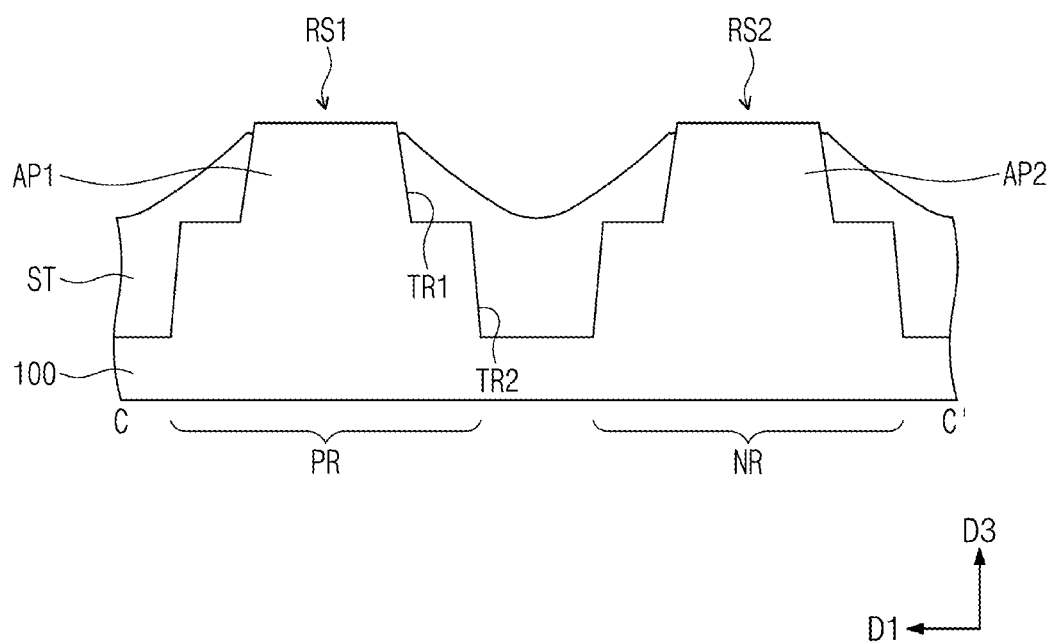
Figure 7D:
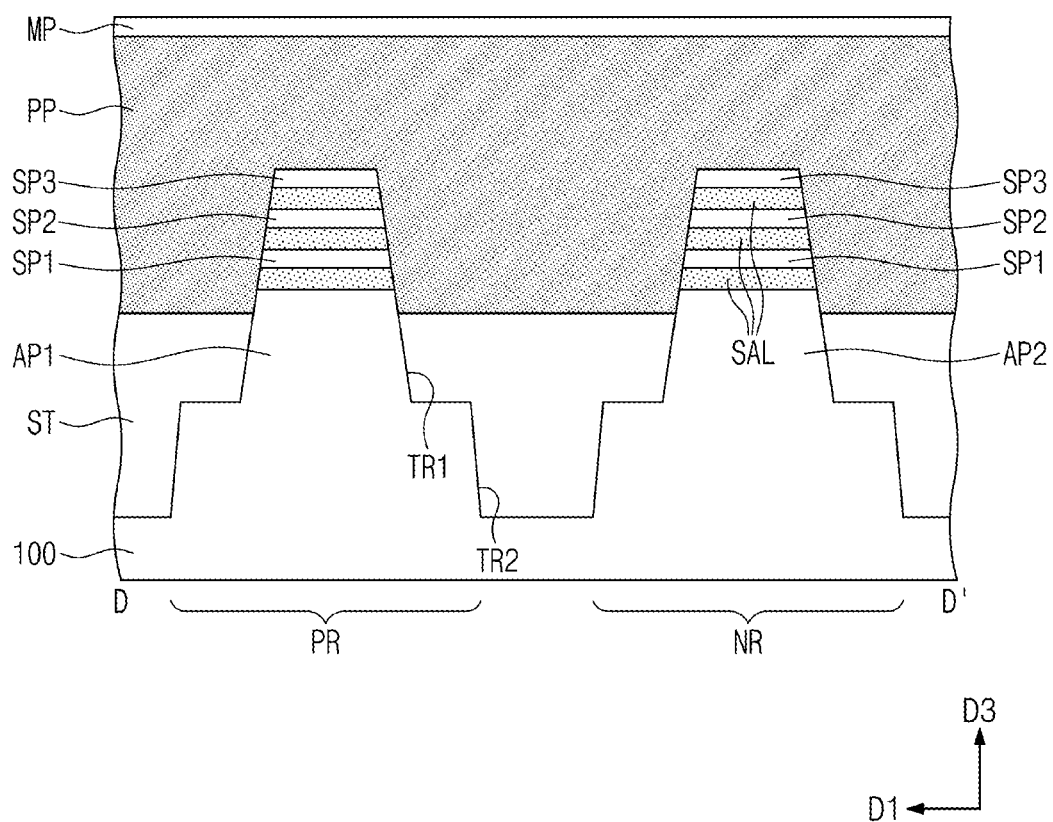
Figure 8A:
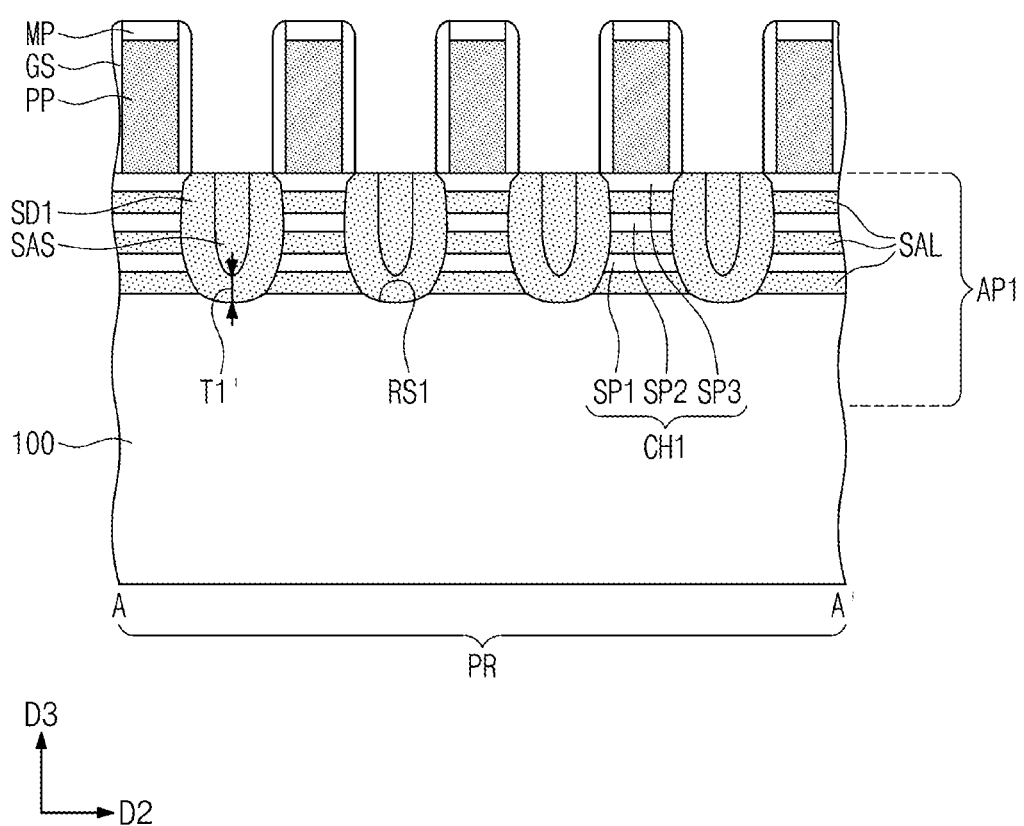
Figure 8B:
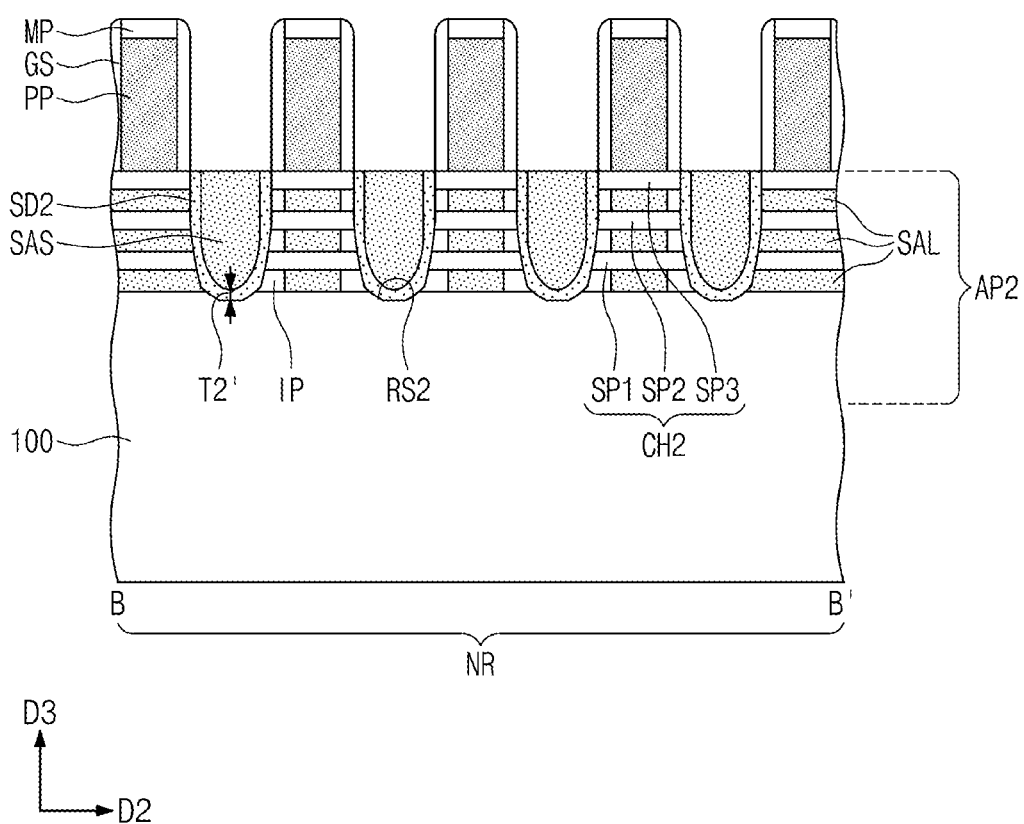
Figure 8C:
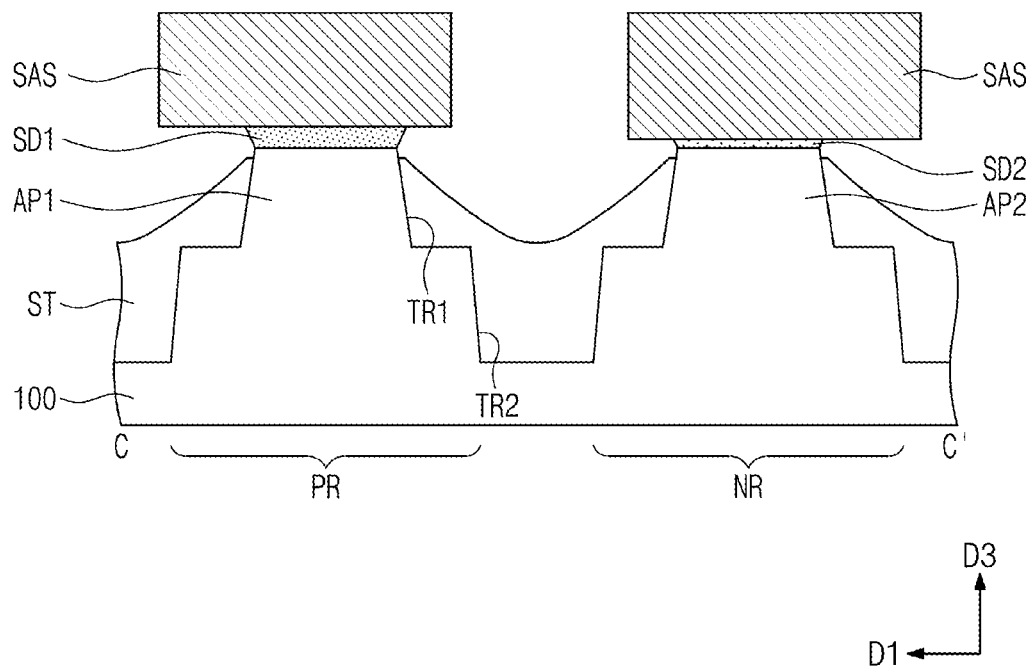
Figure 8D:
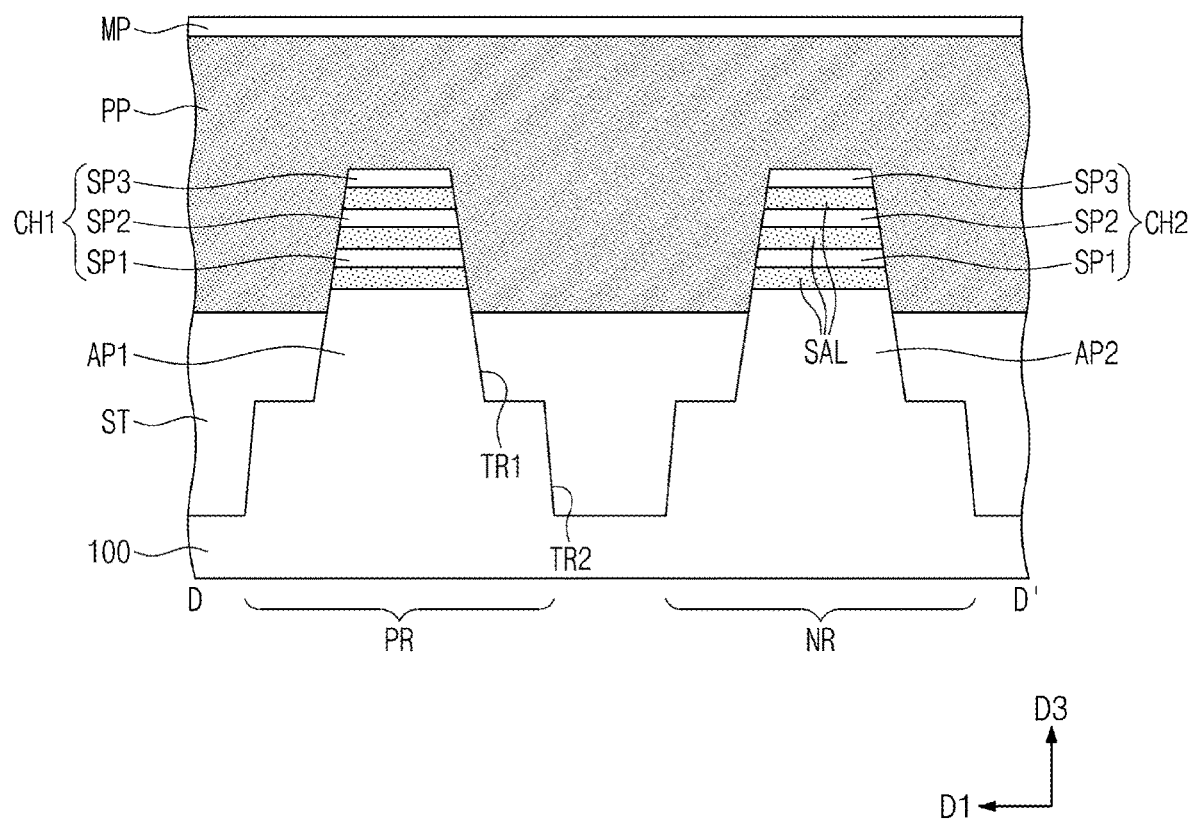
Figure 9A:
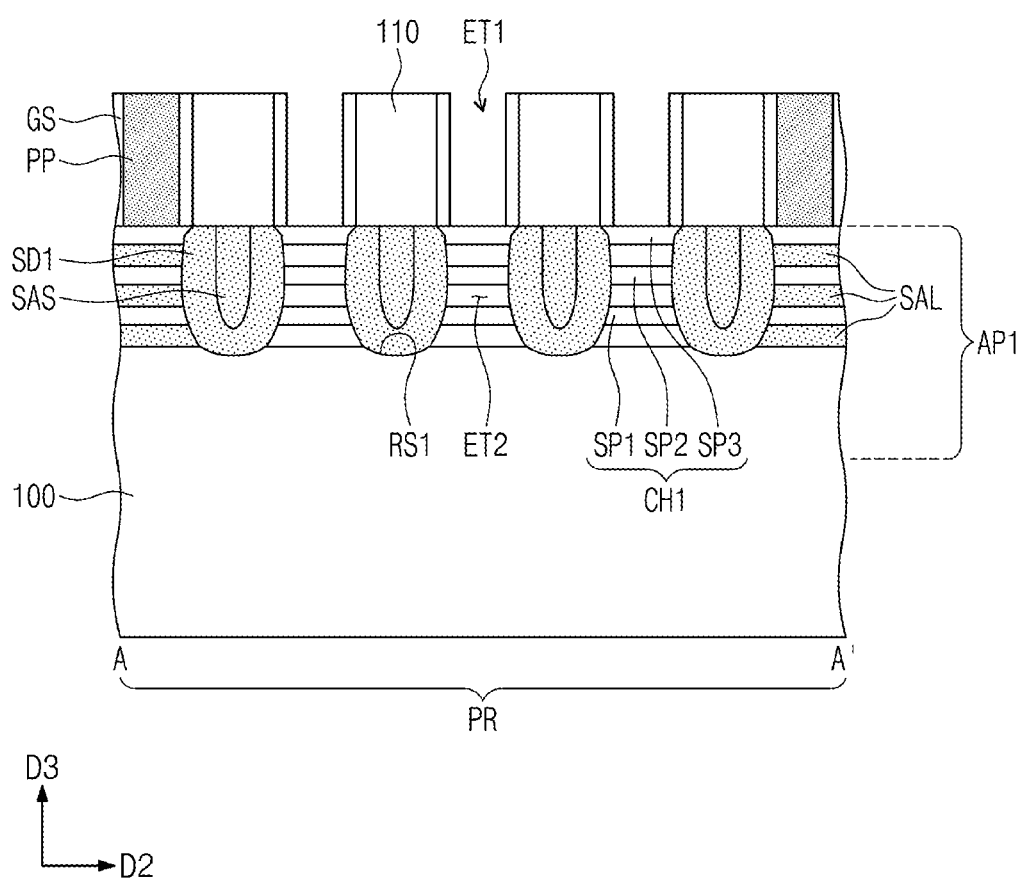
Figure 9B:
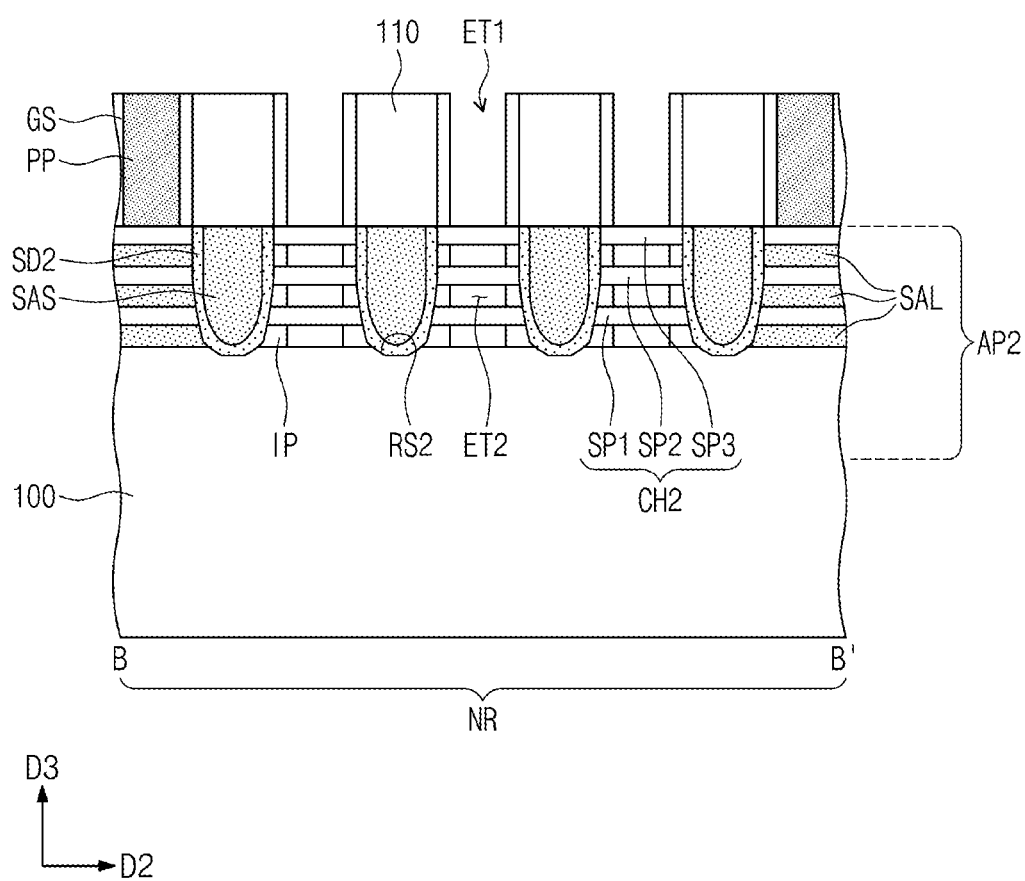
Figure 9C:
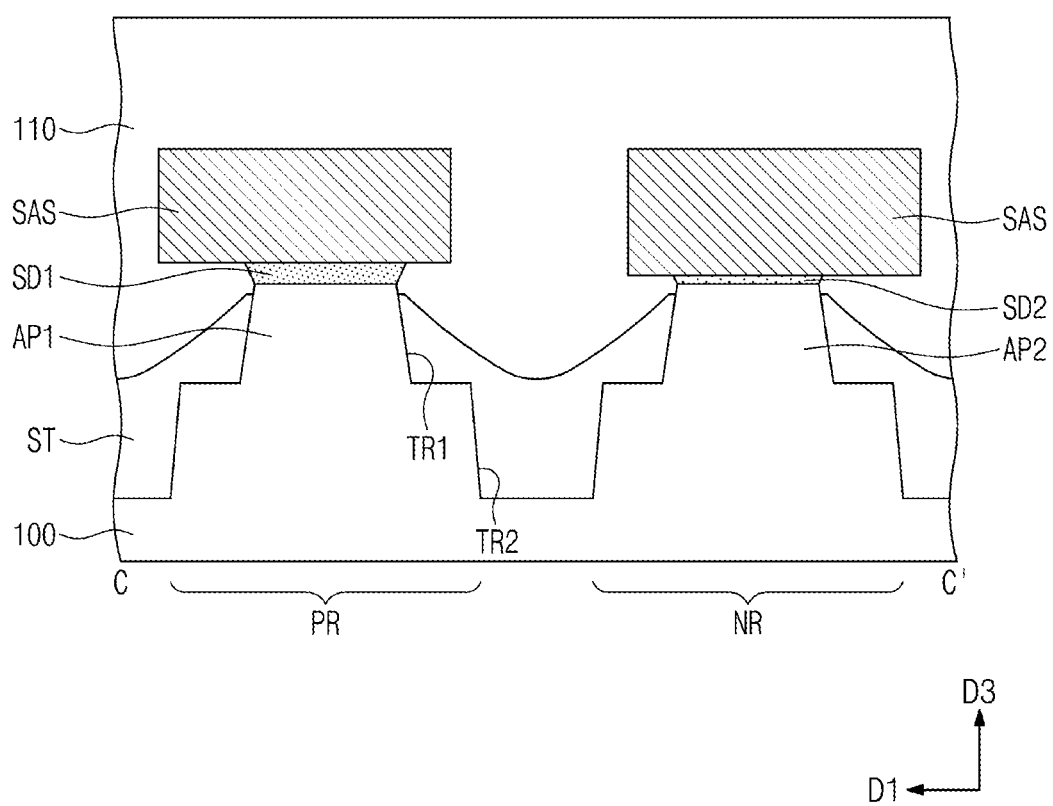
Figure 9D:
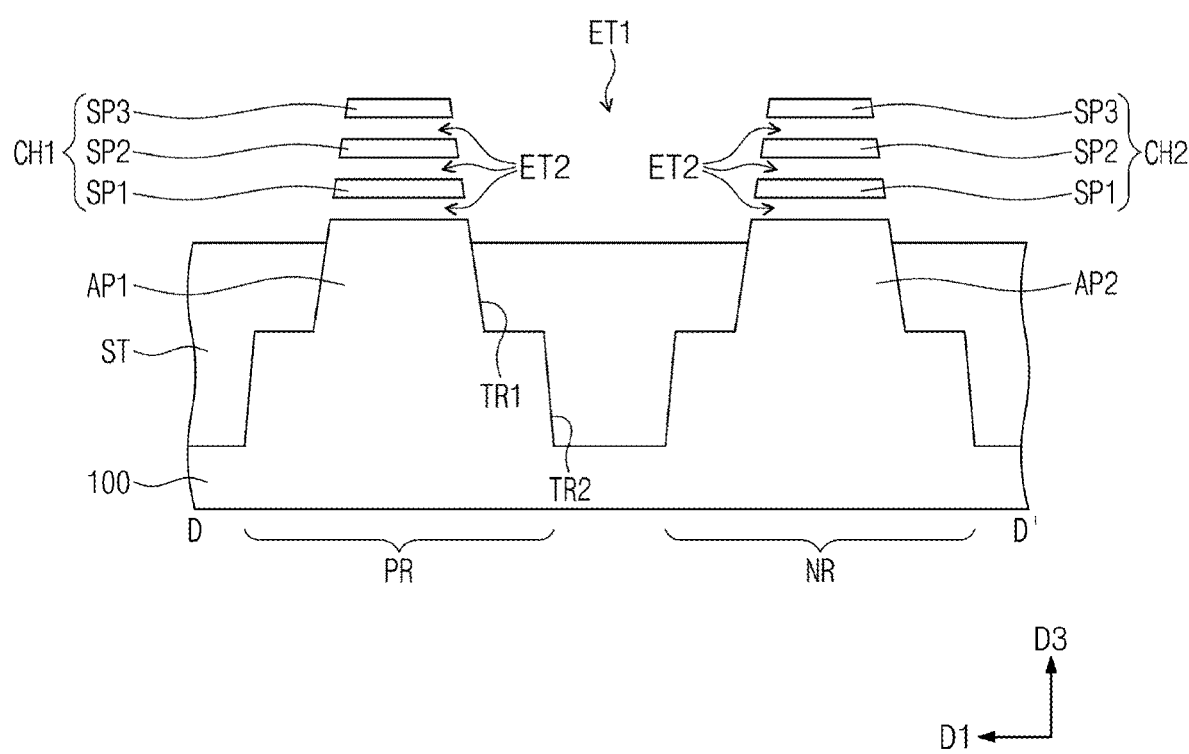
Figure 10A:
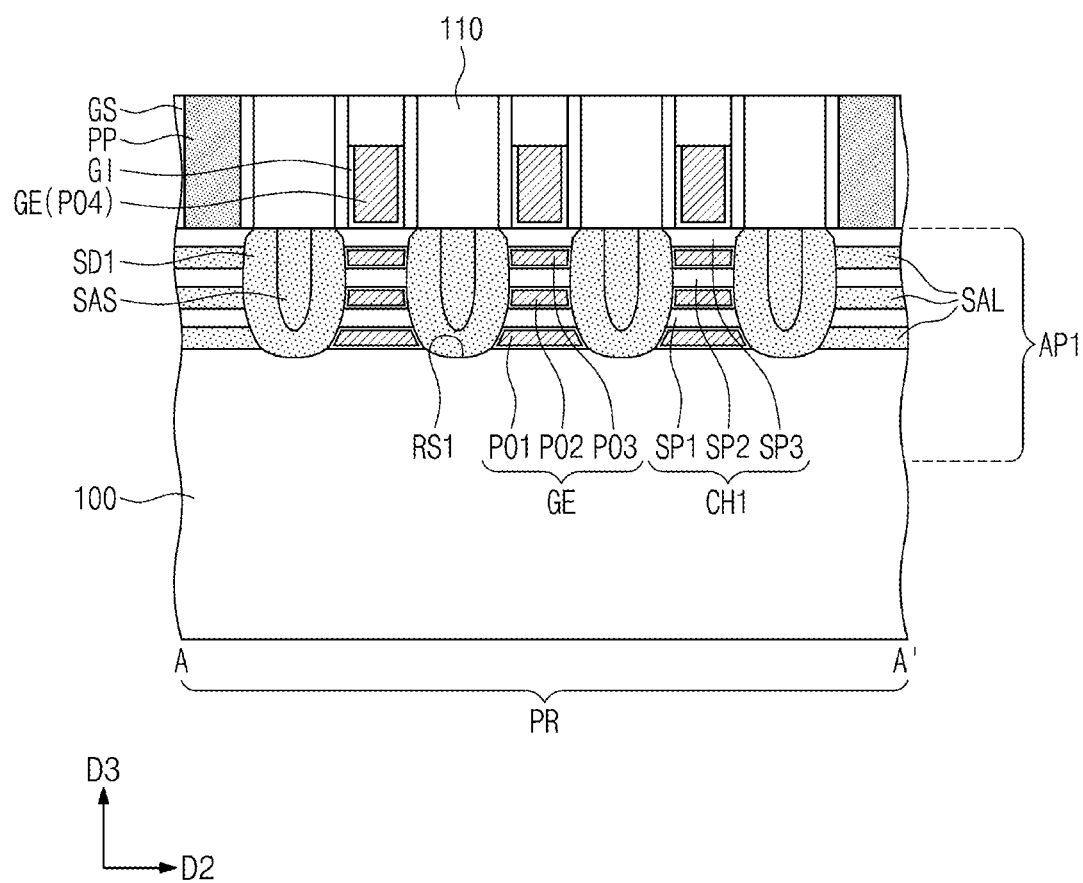
Figure 10B:
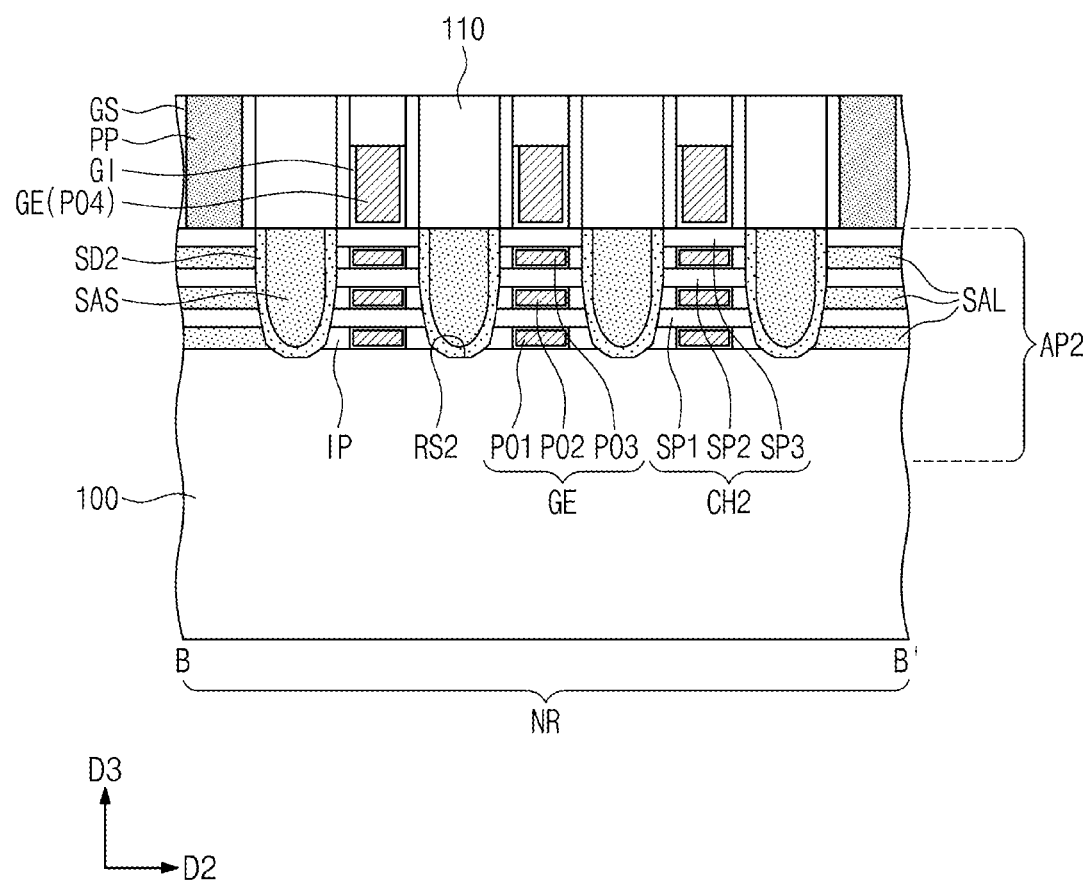
Figure 10C:
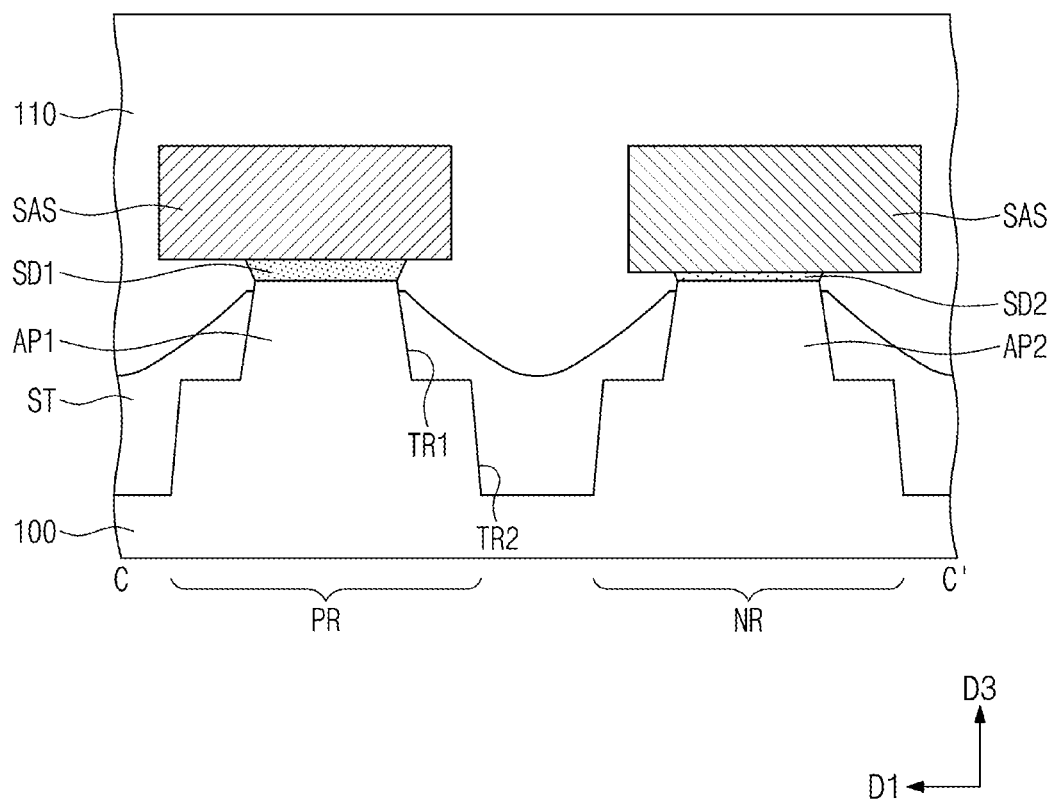
Figure 10D:
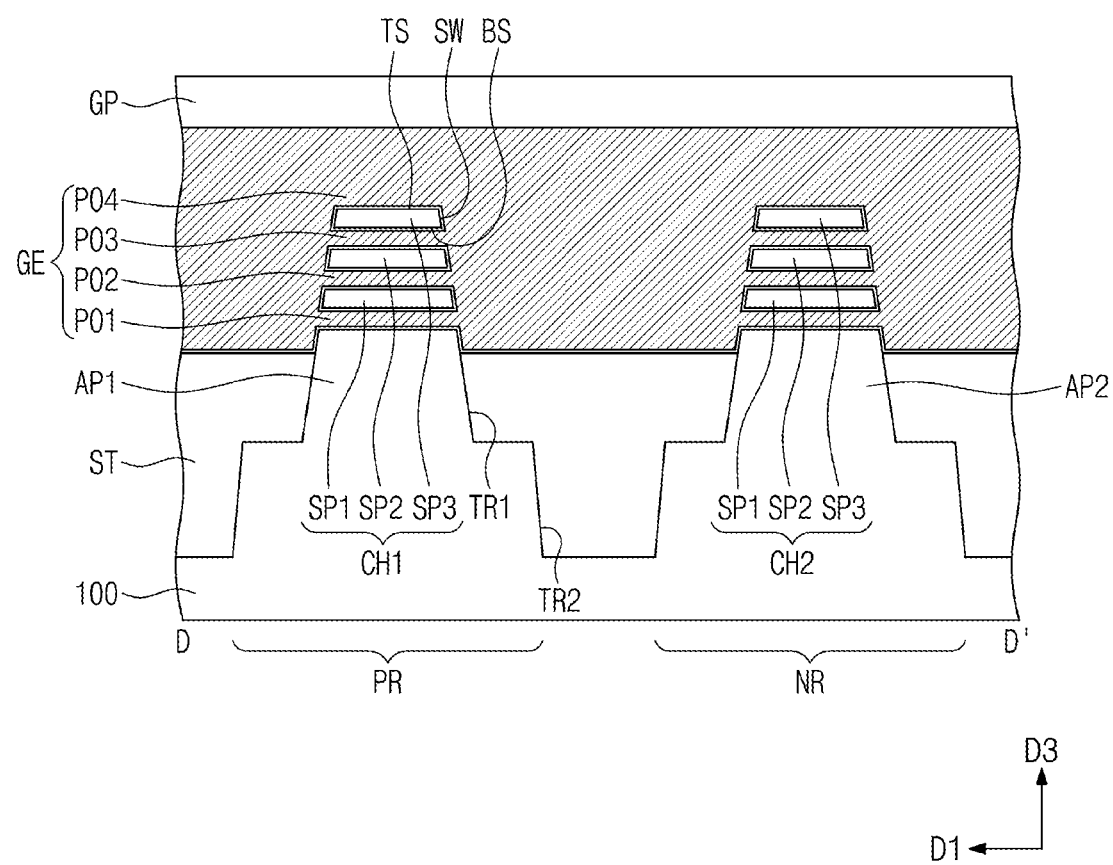

Referring to FIGS. 6A and 6B, on the substrate 100, sacrificial patterns PP may be formed to run across the first and second active patterns AP1 and AP2. Each of the sacrificial patterns PP may be formed to have a linear or bar shape that extends in the first direction D1. The sacrificial patterns PP may be arranged along the second direction D2 at a certain pitch.

For example, the formation of the sacrificial patterns PP may include forming the sacrificial layers SAL on an entire surface of the substrate 100, forming the hardmask patterns MP on the sacrificial layers SAL, and using the hardmask patterns MP as an etching mask to pattern the sacrificial layers SAL. The sacrificial layers SAL may include poly-silicon.

A pair of the gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one of, e.g., SiCN, SiCON, and SiN. Alternatively, the gate spacer layer may be a multiple layer including at least two of SiCN, SiCON, and SiN.

Referring to FIGS. 7A to 7D, the first recesses RS1 may be formed on the upper portion of the first active pattern AP1, and the second recesses RS2 may be formed on the upper portion of the second active pattern AP2. While the first and second recesses RS1 and RS2 are formed, the device isolation layer ST may be recessed on opposite sides of each of the first and second active patterns AP1 and AP2 (see FIG. 7C).

For example, the hardmask patterns MP and the gate spacers GS may be used as an etching mask to etch the upper portion of the first active pattern AP1 to form the first recesses RS1. The first recess RS1 may be formed between a pair of the sacrificial patterns PP. The second recesses RS2 on the upper portion of the second active pattern AP2 may be formed by the same method used for forming the first recesses RS1. The first and second recesses RS1 and RS2 may form the first semiconductor pattern SP1, the second semiconductor pattern SP2, and the third semiconductor pattern SP3.

Referring to FIGS. 8A to 8D, the first source/drain pattern SD1 may be formed in the first recess RS1. For example, a selective epitaxial growth (SEG) process may be performed in which an inner sidewall of the first recess RS1 is used as a seed layer to form the first source/drain pattern SD1. The first source/drain pattern SD1 may be grown from a seed, or the substrate 100 and the first, second, and third semiconductor patterns SP1, SP2, and SP3 exposed to the first recess RS1. The first source/drain pattern SD1 may fill a portion of the first recess RS1. The formation of the first source/drain patterns SD1 may define the first channel pattern CH1 between a pair of the first source/drain patterns SD1. For example, the SEG process may include chemical vapor deposition (CVD) or molecular beam epitaxy (MBE). The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

For example, impurities may be in-situ doped during the SEG process for forming the first source/drain patterns SD1. Alternatively, after the first source/drain pattern SD1 is formed, impurities may be doped into the first source/drain pattern SD1. The first source/drain pattern SD1 may be doped to have a first conductivity type (e.g., p-type).

A sacrificial semiconductor pattern SAS may be formed on the first source/drain pattern SD1, filling an occupied portion of the first recess RS1. In this case, the sacrificial semiconductor pattern SAS may include silicon germanium (SiGe). For example, the first source/drain pattern SD1 may contain germanium (Ge) whose concentration is low, and the sacrificial semiconductor pattern SAS may contain germanium (Ge) whose concentration is high.

The sacrificial layers SAL exposed to the second recesses RS2 may be partially etched to form inner spacers IP. Second source/drain patterns SD2 may be formed in corresponding second recesses RS2. For example, a selective epitaxial growth (SEG) process may be performed in which an inner sidewall of the second recess RS2 is used as a seed to form the second source/drain pattern SD2. The second source/drain pattern SD2 may fill a portion of the second recess RS2. For example, the second source/drain pattern SD2 may include the same semiconductor element (e.g., Si) as that of the substrate 100. The second source/drain pattern SD2 may be doped to have a second conductivity type (e.g., n-type).

A sacrificial semiconductor pattern SAS may be formed on the second source/drain pattern SD2, filing an unoccupied portion of the second recess RS2. For example, the sacrificial semiconductor pattern SAS may include silicon-germanium (SiGe). The sacrificial semiconductor pattern SAS may contain germanium (Ge) whose concentration is high.

The first source/drain pattern SD1 may have a first thickness T1'. The second source/drain pattern SD2 may have a second thickness T2'. The first thickness T1' may be greater than the second thickness T2'. For example, the first source/drain pattern SD1 may be formed thicker than the second source/drain pattern SD2. A width in the second direction D2 of the sacrificial semiconductor pattern SAS on the first active region PR may be less than a width in the second direction D2 of the sacrificial semiconductor pattern SAS on the second active region NR. A width of the sacrificial semiconductor pattern SAS may be defined to indicate a width at a central or upper portion of the sacrificial semiconductor pattern SAS.

Referring to FIGS. 9A to 9D, the first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

The exposed sacrificial patterns PP may be selectively removed. The removal of the sacrificial patterns PP may form first empty spaces ET1 that expose the first and second active patterns AP1 and AP2 (see FIG. 9D).

In contrast, a portion of the sacrificial patterns PP may not be removed. For example, there may be no removal of the sacrificial pattern PP positioned on a cell boundary. A mask layer may be formed on the sacrificial patterns PP that should not be removed, such that some of the sacrificial patterns PP may remain without being removed. When the sacrificial pattern PP is removed, the first and second active patterns AP1 and AP2 may be exposed through the first empty space ET1. The first empty space ET1 may expose the sacrificial layers SAL of each of the first and second active patterns AP1 and AP2.

The sacrificial layers SAL exposed through the first empty space ET1 may be selectively removed. For example, an etching process that selectively etches the sacrificial layers SAL may be performed such that only the sacrificial layers SAL may be removed, and such that the first, second, and third semiconductor patterns SP1, SP2, and SP3 may remain. In this procedure, the inner spacers IP may prevent the occurrence of defects in the second source/drain pattern SD2.

As the sacrificial layers SAL are selectively removed, only the first, second, and third semiconductor patterns SP1, SP2, and SP3 may remain on each of the first and second active patterns AP1 and AP2. Second empty spaces ET2 may be formed in corresponding areas from which the sacrificial layers SAL are removed. The second empty spaces ET2 may be defined between the first, second, and third semiconductor patterns SP1, SP2, and SP3.

Referring to FIGS. 10A to 10D, the gate dielectric layer GI may be conformally formed in the first and second empty spaces ET1 and ET2. The gate electrode GE may be formed on the gate dielectric layer GI. The gate electrode GE may be formed to fill the first and second empty spaces ET1 and ET2. For example, the gate electrode GE may include the first, second, and third parts PO1, PO2, and PO3 that fill the second empty spaces ET2. The gate electrode GE may further include the fourth part PO4 that fills the first empty space ET1. The gate capping pattern GP may be formed on the gate electrode GE.

Referring back to FIGS. 1 and 2A to 2D, the second interlayer dielectric layer 120 may be formed on the first interlayer dielectric layer 110. The second interlayer dielectric layer 120 may include a silicon oxide layer. The first active contact AC1 may be formed to penetrate the second interlayer dielectric layer 120 and the first interlayer dielectric layer 110 and to electrically connect with the first source/drain pattern SD1, and the second active contact AC2 may be formed to electrically connect with the second source/drain pattern SD2. The first silicide pattern SC1 may be formed between the first active contact AC1 and the first source/drain pattern SD1. The second silicide pattern SC2 may be formed between the second active contact AC2 and the second source/drain pattern SD2. The gate contact GC may be formed to penetrate the second interlayer dielectric layer 120 and the gate capping pattern GP and to electrically connect with the gate electrode GE.

A pair of the separation structures DB may be formed on opposite sides of the logic cell LC. The separation structure DB may penetrate the second interlayer dielectric layer 120, the remaining sacrificial pattern PP, and the upper portion of the active pattern AP1 or AP2 below the sacrificial pattern PP. The separation structure DB may include a dielectric material, e.g., a silicon oxide layer or a silicon nitride layer.

The third interlayer dielectric layer 130 may be formed on the gate contacts GC and the first and second active contacts AC1 and AC2. The first metal layer M1 may be formed in the third interlayer dielectric layer 130. The fourth interlayer dielectric layer 140 may be formed on the third interlayer dielectric layer 130. The second metal layer M2 may be formed in the fourth interlayer dielectric layer 140.

Figure 11A:
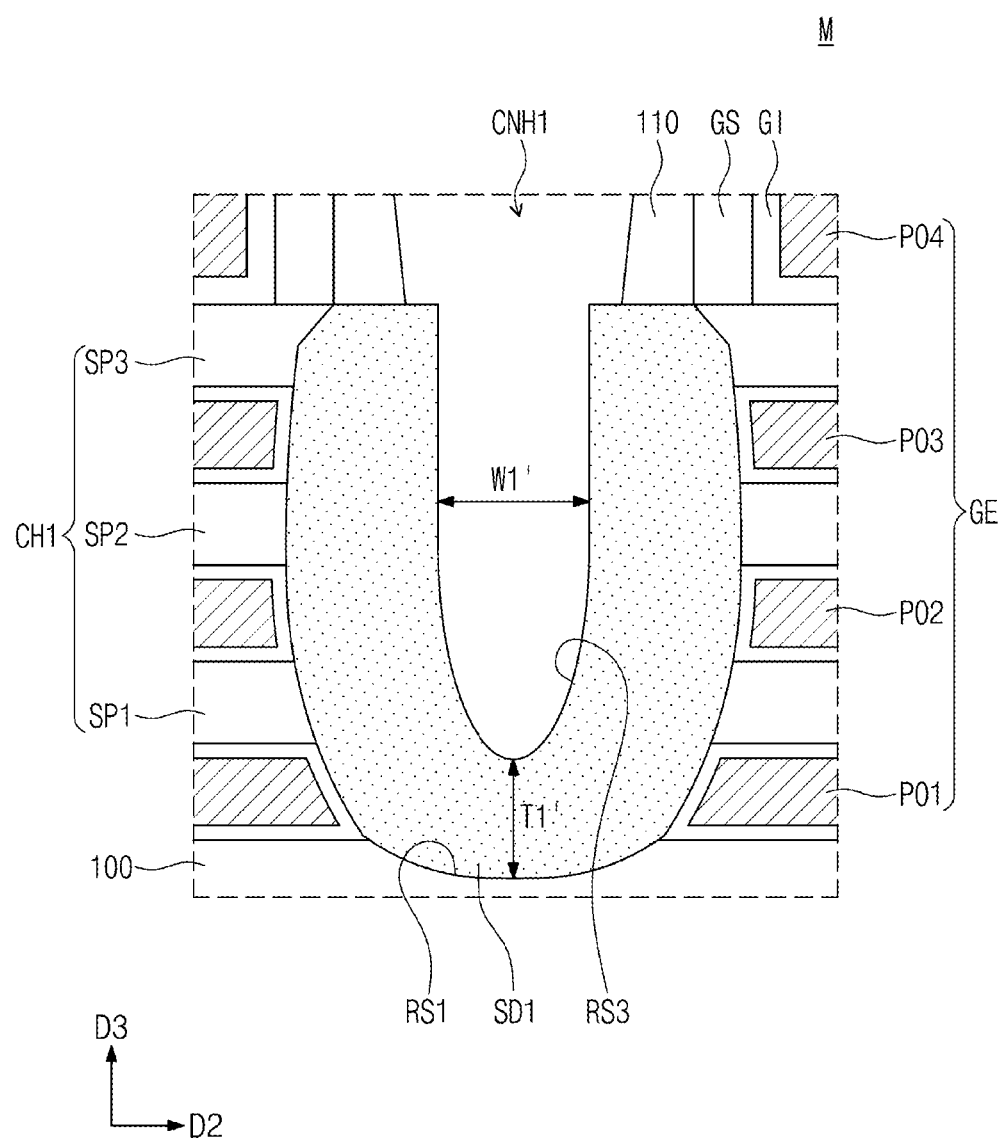
FIGS. 11A to 12B illustrate cross-sectional views showing stages in a method of forming first and second silicide patterns according to some embodiments.
Figure 11B:
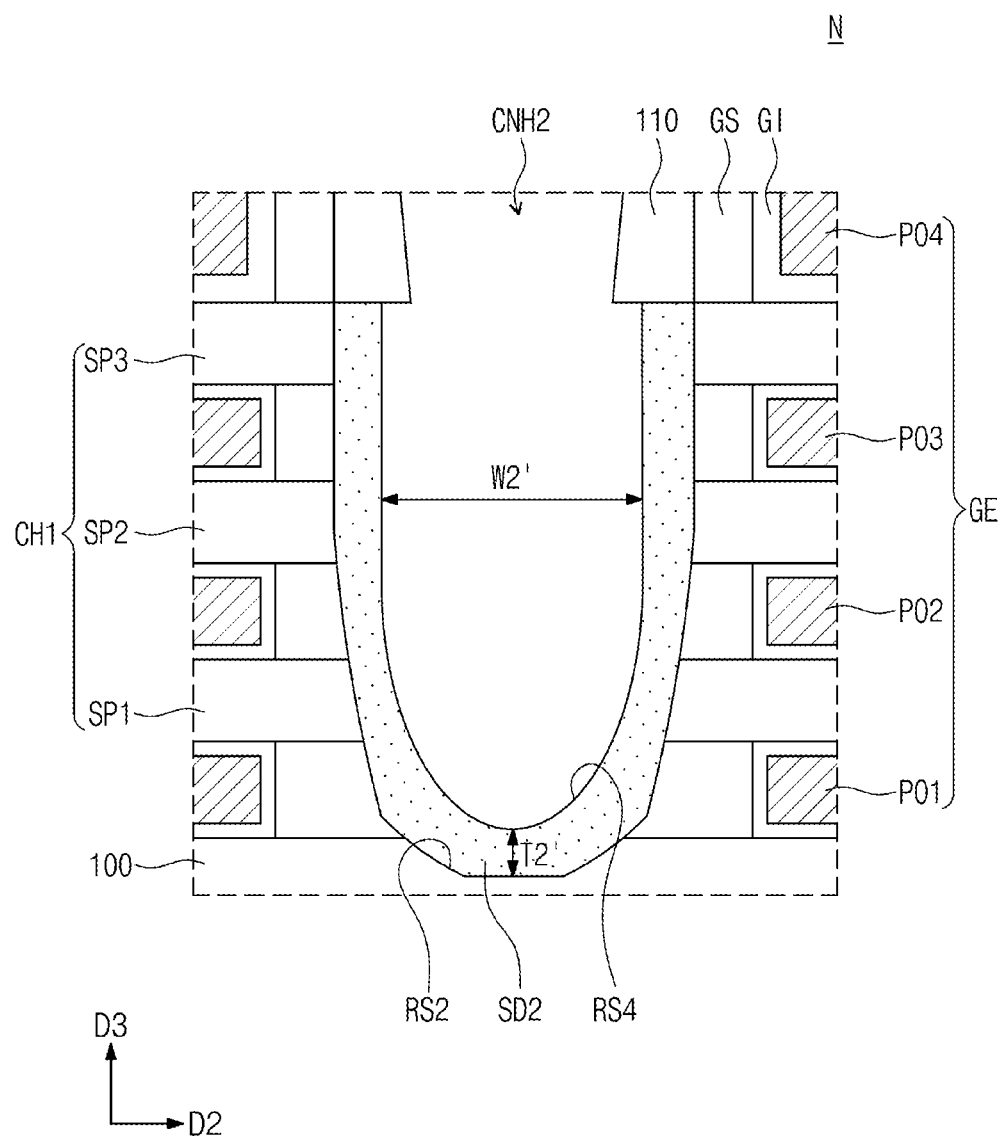
Figure 12A:
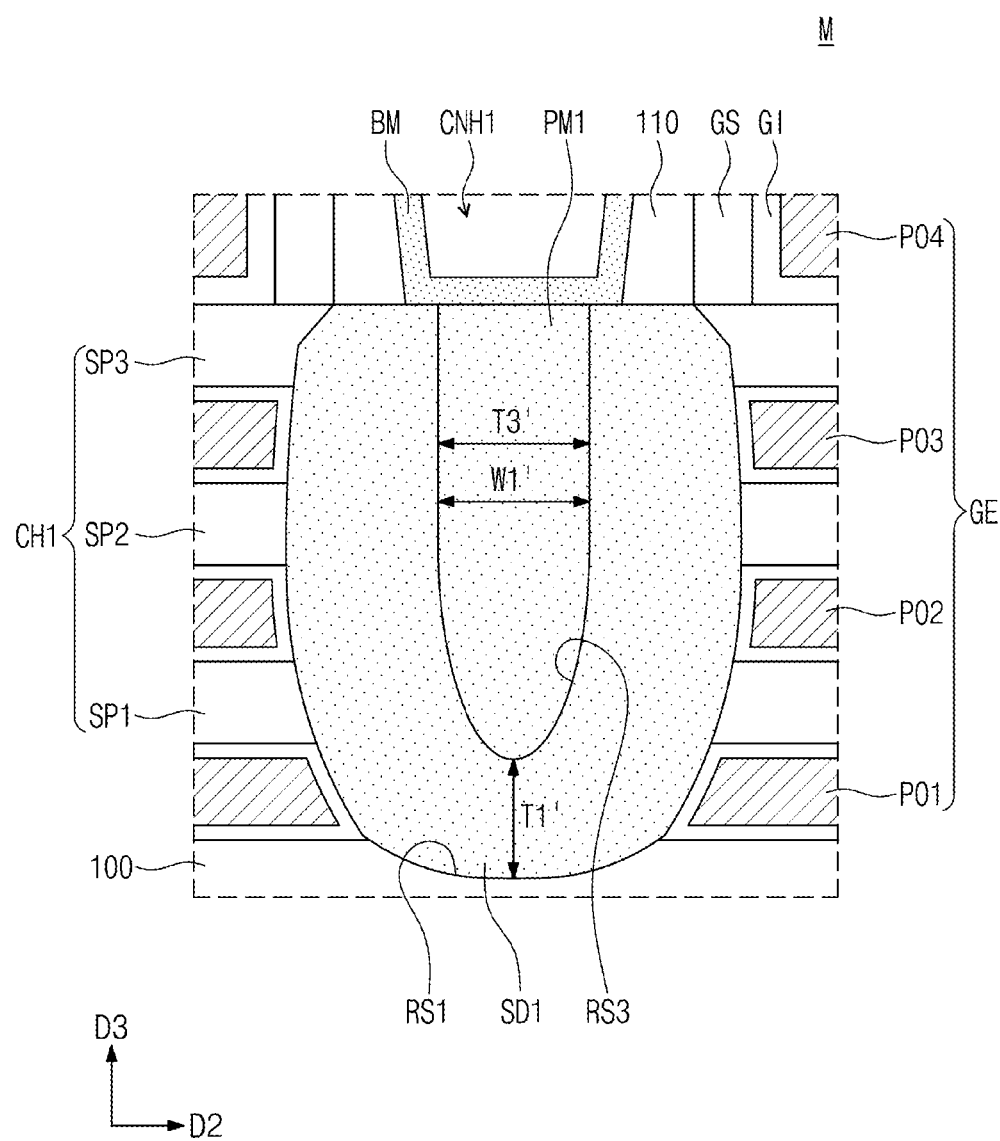
Figure 12B:
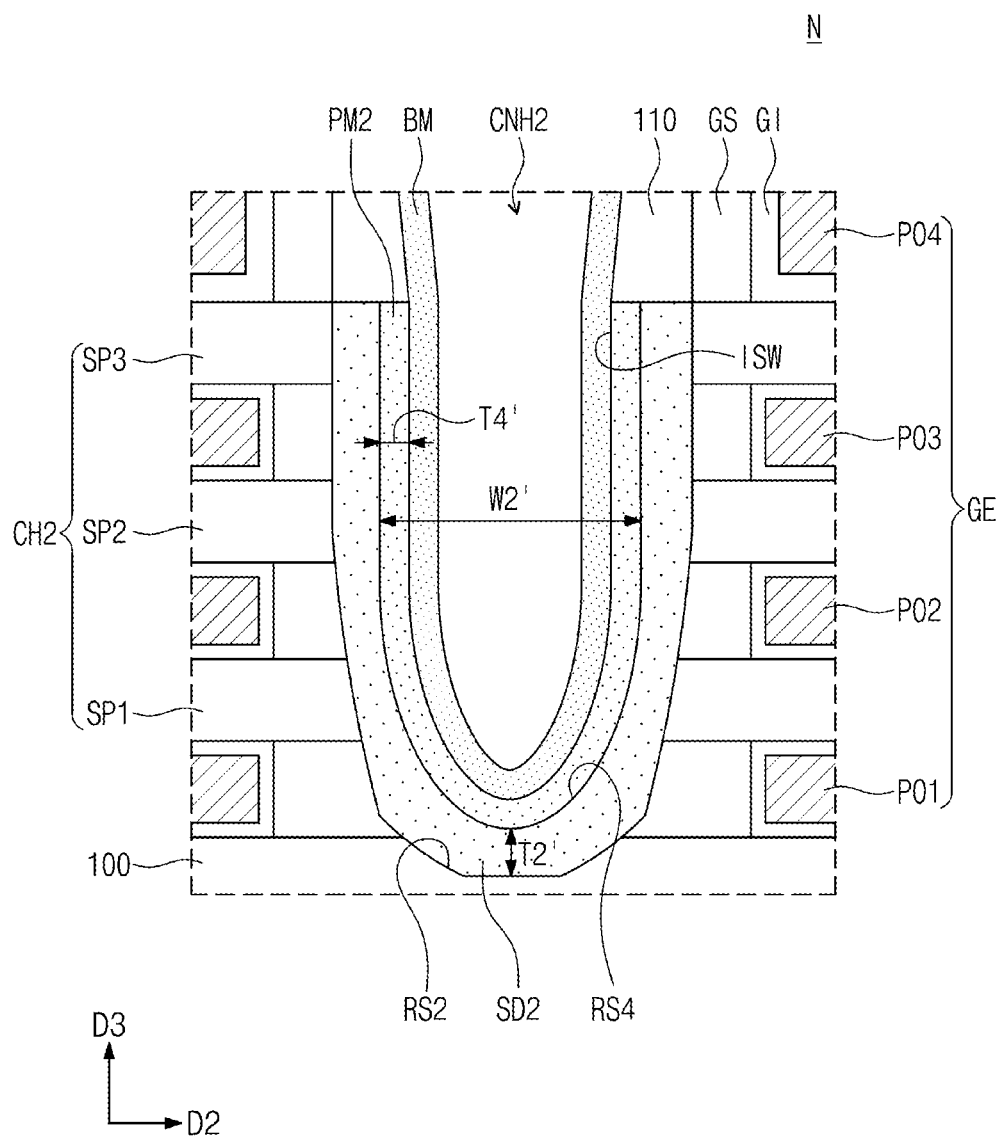

FIGS. 11A to 12B illustrate cross-sectional views showing stages in a method of forming first and second silicide patterns according to some embodiments. In detail, FIGS. 11A and 12A illustrate cross-sectional views showing section M of FIG. 2A, and FIGS. 11B and 12B illustrate cross-sectional views showing section N of FIG. 2B. With reference to FIGS. 11A to 12B, the following will describe in detail the formation of active contacts and silicide patterns according to some embodiments.

Referring to FIGS. 11A and 11B, a first contact hole CNH1 may be formed on the first source/drain pattern SD1, penetrating the first interlayer dielectric layer 110. The first contact hole CNH1 may expose the sacrificial semiconductor pattern SAS. A second contact hole CNH2 may be formed on the second source/drain pattern SD2, penetrating the first interlayer dielectric layer 110. The second contact hole CNH2 may expose the sacrificial semiconductor pattern SAS.

An etching process may be performed on the exposed sacrificial semiconductor pattern SAS. A wet etching process may be adopted as the etching process. The sacrificial semiconductor pattern SAS with high germanium concentration may be etched at high rates in the etching process. Therefore, the sacrificial semiconductor pattern SAS may be selectively removed.

The removal of the sacrificial semiconductor pattern SAS may form the third recess RS3 on the upper portion of the first source/drain pattern SD1, and may also form the fourth recess RS4 on the upper portion of the second source/drain pattern SD2. The third recess RS3 may have a first width W1'. The fourth recess RS4 may have a second width W2'. The first width W1' may be less than the second width W2'. The first width W1' may be defined to refer to a width at a central or upper portion of the third recess RS3. The second width W2' may be defined to refer to a width at a central or upper portion of the fourth recess RS4.

Referring to FIGS. 12A and 12B, a first preliminary metal pattern PM1 may be formed on the first source/drain pattern SD1. The first preliminary metal pattern PM1 may completely fill the third recess RS3. This is because the third recess RS3 is formed to have a relatively small thickness (or small first width W1'). The first preliminary metal pattern PM1 may include, e.g., at least one of titanium, tantalum, tungsten, nickel, and cobalt.

A second preliminary metal pattern PM2 may be formed on the second source/drain pattern SD2. The second preliminary metal pattern PM2 may partially fill the fourth recess RS4. For example, the second preliminary metal pattern PM2 may be conformally formed along an inner sidewall of the fourth recess RS4. The second preliminary metal pattern PM2 may include the same material as that of the first preliminary metal pattern PM1. Alternatively, the second preliminary metal pattern PM2 may include a different material from that of the first preliminary metal pattern PM1.

The first preliminary metal pattern PM1 may have the third thickness T3'. The third thickness T3' of the first preliminary metal pattern PM1 may be defined to refer to a thickness at a central or upper portion of the first preliminary metal pattern PM1. The second preliminary metal pattern PM2 may have a fourth thickness T4'. The third thickness T3' may be greater than the fourth thickness T4'. The third thickness T3' may be substantially the same as the first width W1' of the third recess RS3.

The barrier pattern BM may be formed on each of the first and second preliminary metal pattern PM1 and PM2. The barrier pattern BM on the first preliminary metal pattern PM1 may be conformally formed along an inner sidewall of the first contact hole CNH1 and a top surface of the first preliminary metal pattern PM1. The barrier pattern BM on the second preliminary metal pattern PM2 may be conformally formed along an inner sidewall ISW of the second preliminary metal pattern PM2 and an inner sidewall of the second contact hole CNH2. The barrier pattern BM on the first preliminary metal pattern PM1 may not extend into the first recess RS1. The barrier pattern BM on the second preliminary metal pattern PM2 may extend into the second recess RS2.

Referring back to FIGS. 3 and 4, an annealing process may be performed on the first preliminary metal pattern PM1 and the second preliminary metal pattern PM2. The first preliminary metal pattern PM1 and the first source/drain pattern SD1 may chemically react with each other to form the first silicide pattern SC1. The second preliminary metal pattern PM2 and the second source/drain pattern SD2 may chemically react with each other to form the second silicide pattern SC2. The residual pattern RP may be constituted by the first preliminary metal pattern PM1 that does not react with the first source/drain pattern SD1.

The first silicide pattern SC1 may have the thickness T3 greater than the thickness T3' of the first preliminary metal pattern PM1. The second silicide pattern SC2 may have the thickness T4 greater than the thickness T4' of the second preliminary metal pattern PM2. The first source/drain pattern SD1 may have eth thickness T1 less than the thickness T1' of the first source/drain pattern SD1 that undergoes no annealing process. The second source/drain pattern SD2 may have the thickness T2 less than the thickness T2' of the second source/drain pattern SD2 that undergoes no annealing process. This is because silicon in the first source/drain pattern SD1 and silicon in the first preliminary metal pattern PM1 chemically react with each other to form the first silicide pattern SC1, and silicon in the second source/drain pattern SD2 and silicon in the second preliminary metal pattern PM2 chemically react with each other to form the second silicide pattern SC2.

The conductive pattern FM may be formed on the barrier pattern BM. The conductive pattern FM may fill an occupied portion of each of the first contact hole CNH1, the second contact hole CNH2, and the second recess RS2. It may therefore be possible to form the first active contact AC1 and the second active contact AC2.

Figure 13:
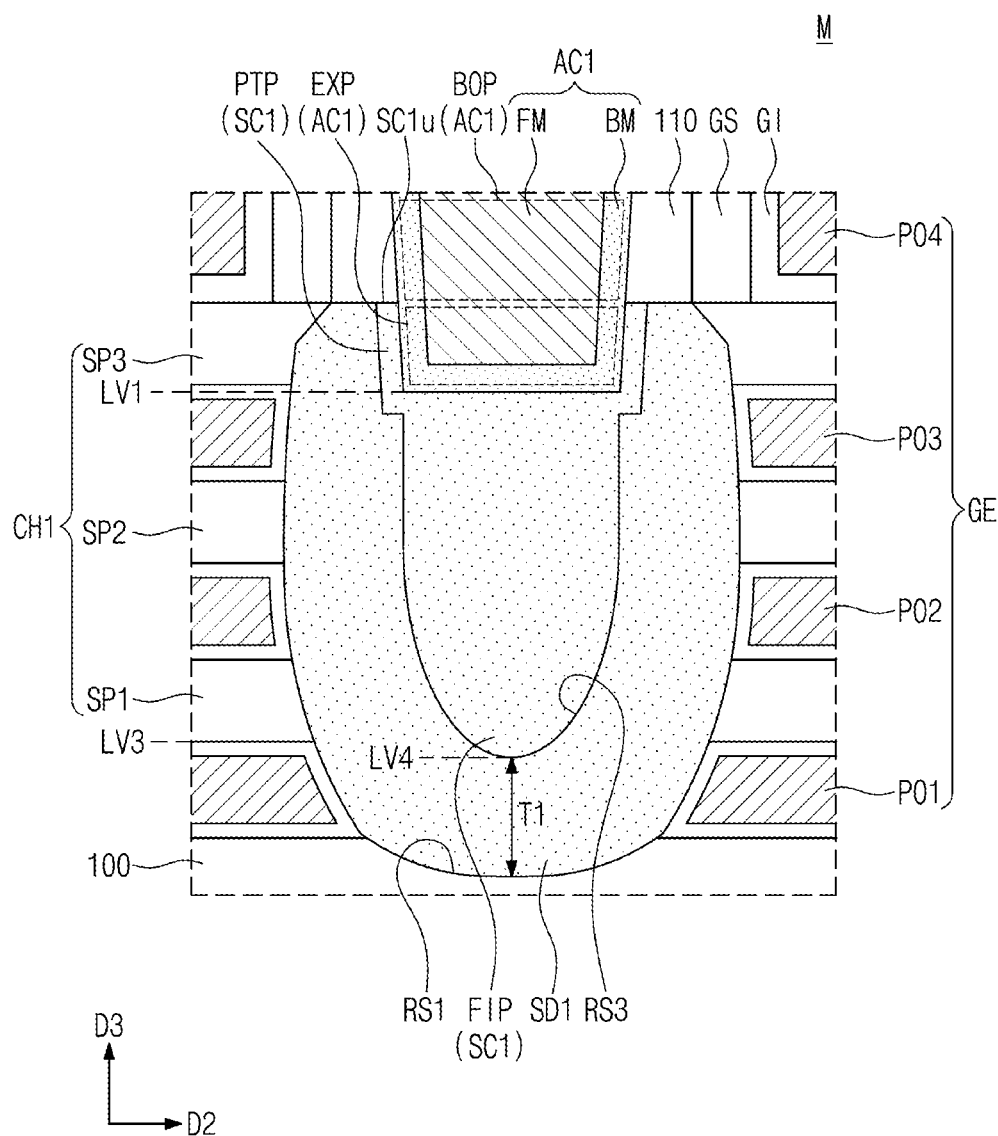
FIG. 13 illustrates a cross-sectional view of section M depicted in FIG. 2A.

FIG. 13 illustrates a cross-sectional view of section M depicted in FIG. 2A, showing a semiconductor device according to some embodiments. In the embodiment that follows, a detailed description of technical features repetitive to those discussed above with reference to FIGS. 1, 2A to 2D, and 3 will be omitted, and a difference thereof will be discussed in detail.

Referring to FIG. 13, the first active contact AC1 may include an extension part EXP that extends into the first recess RS1 and a body part BOP on the extension part EXP. The extension part EXP and the body part BOP of the first active contact AC1 may be connected to each other. The extension part EXP of the first active contact AC1 may have a width less than that of the body part BOP of the first active contact AC1. The first recess RS1 may be provided therein with the first source/drain pattern SD1, the first silicide pattern SC1, and the extension part EXP of the first active contact AC1. A lowermost portion of the first active contact AC1 may be located at the first level LV1. The first level LV1 may be lower than a level of a top surface of the first source/drain pattern SD1.

The first silicide pattern SC1 may include a filling part FIP that fills the third recess RS3 and a protrusion part PTP that extends from the filling part FIP along a bottom surface and a sidewall of the extension part EXP of the first active contact AC1. The protrusion part PTP may have a thickness less than that of the filling part FIP.

The first level LV1 may be lower than a level of an uppermost surface SC1$u$ of the first silicide pattern SC1. The uppermost surface SC1$u$ of the first silicide pattern SC1 may be an uppermost surface of the protrusion part PTP.

Figure 14:
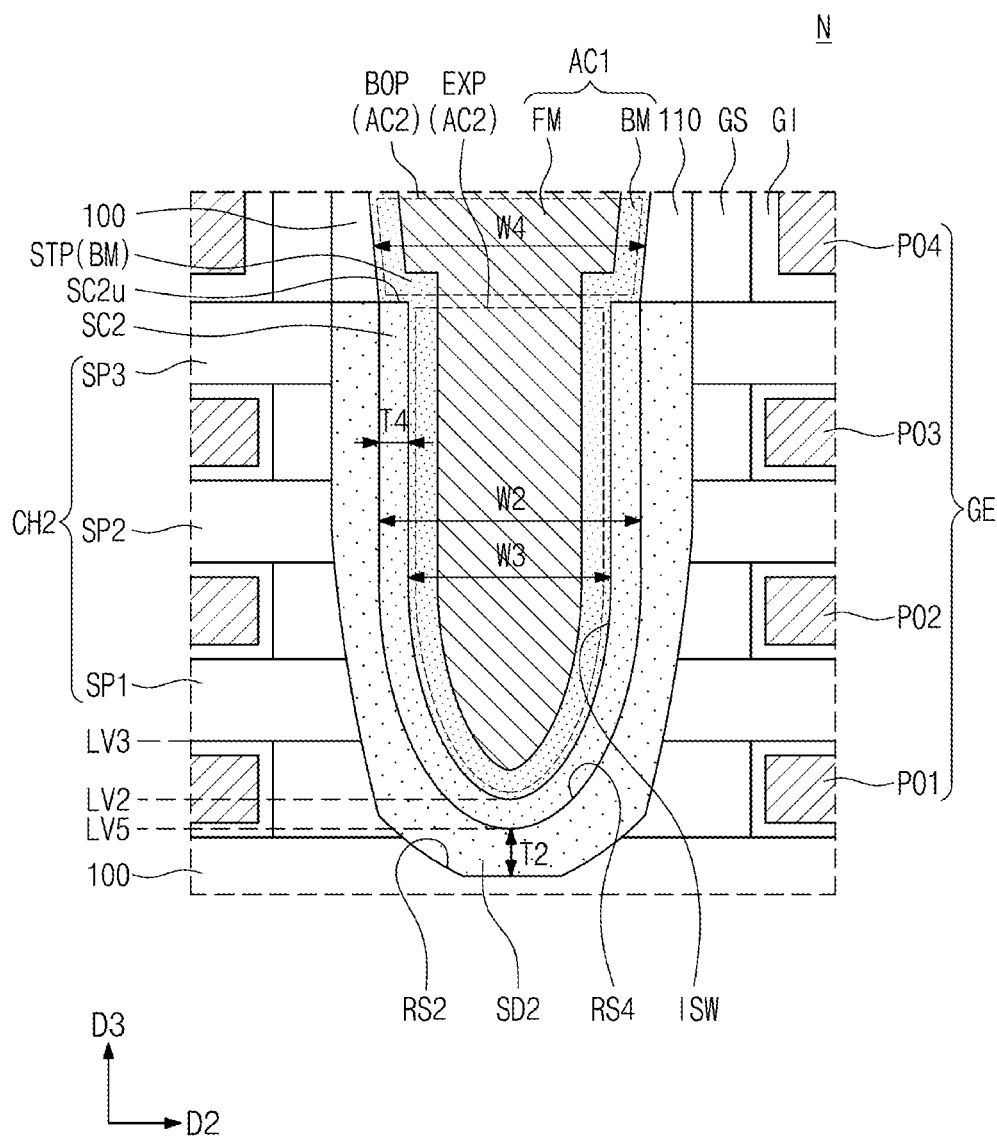
FIG. 14 illustrates a cross-sectional view of section N depicted in FIG. 2B.
Figure 15A:
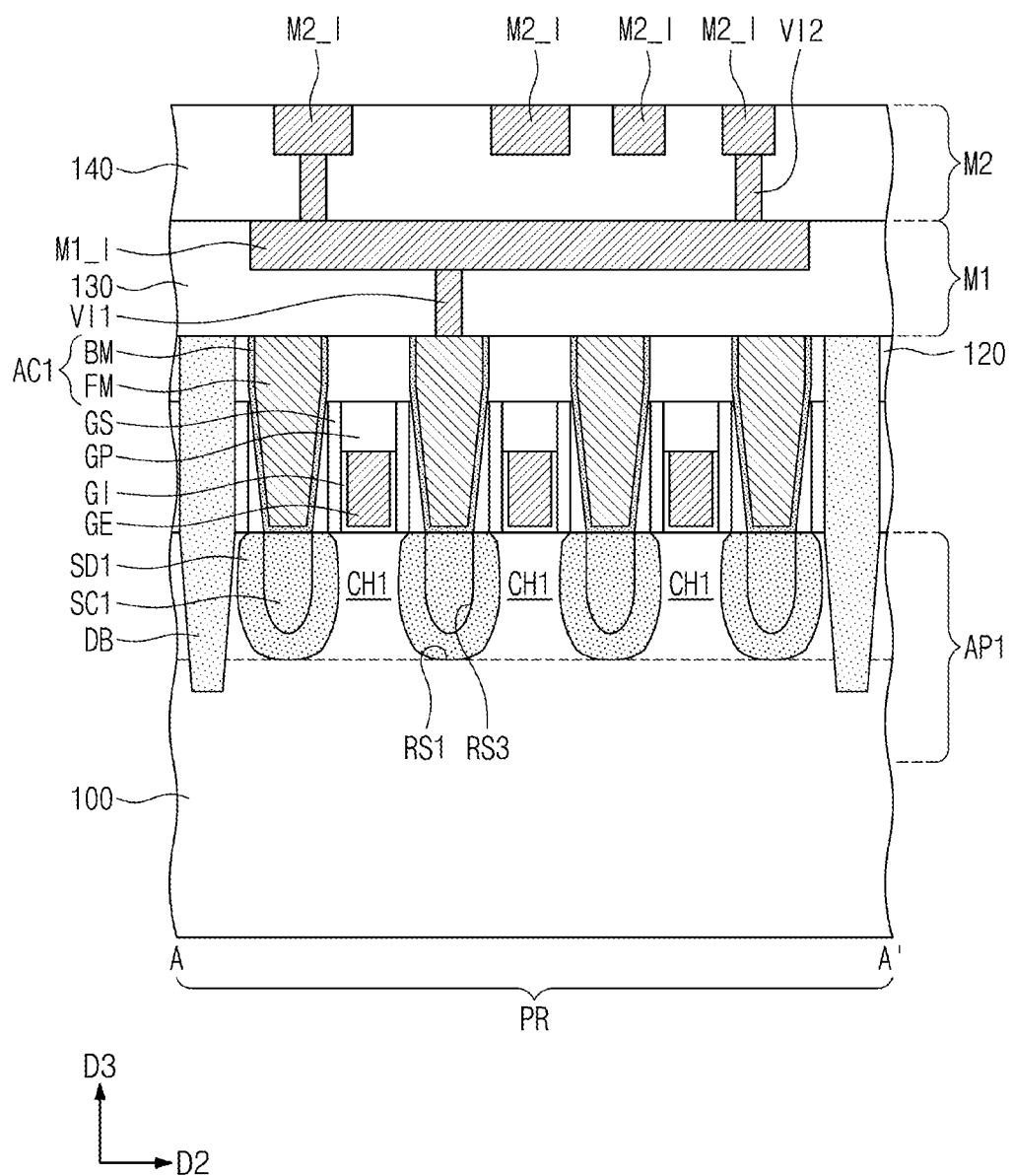
FIGS. 15A, 15B, 15C, and 15D illustrate cross-sectional views respectively taken along lines A-A', B-B', C-C', and D-D' of FIG. 1, showing a semiconductor device according to some embodiments.
Figure 15B:
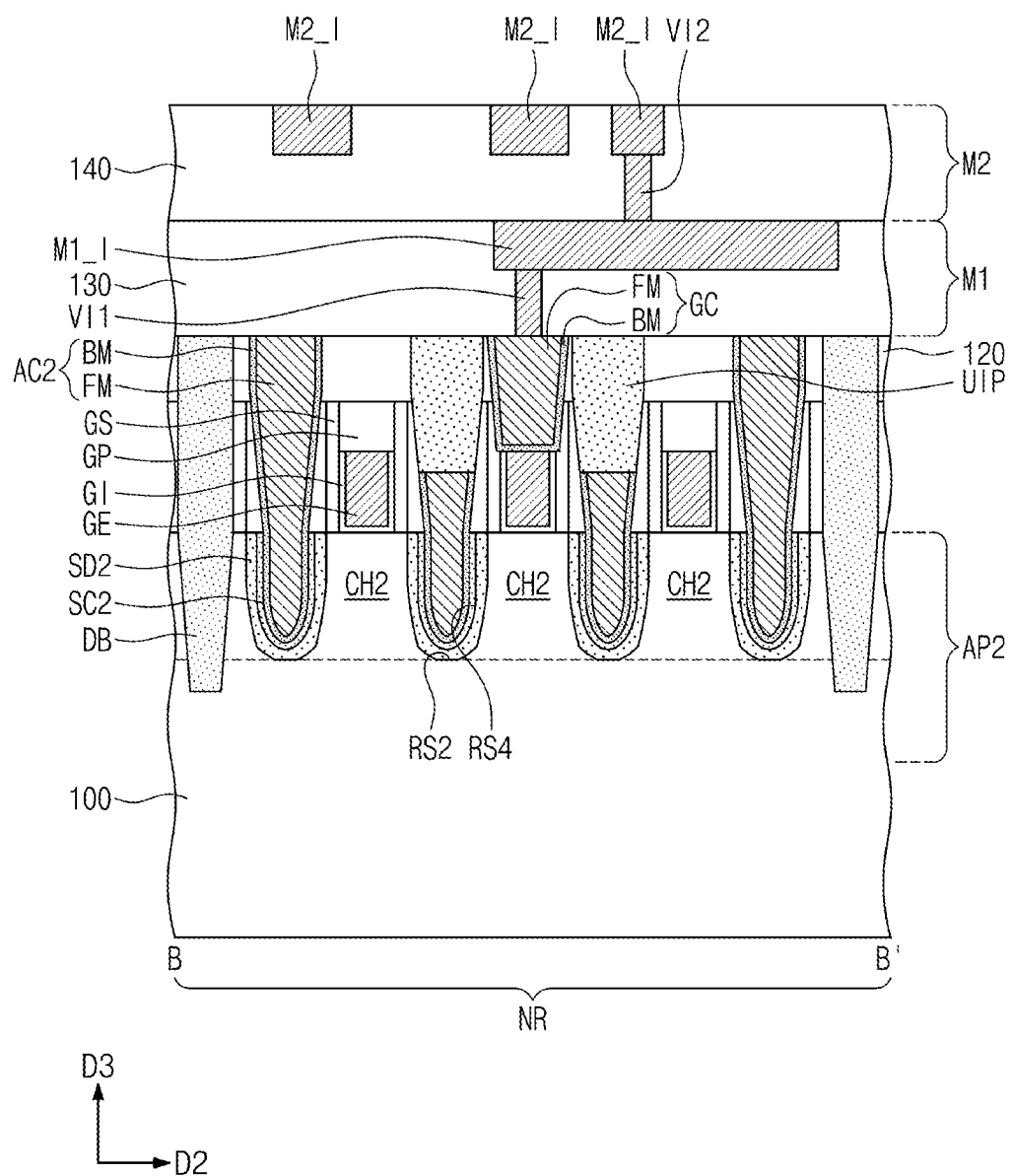
Figure 15C:
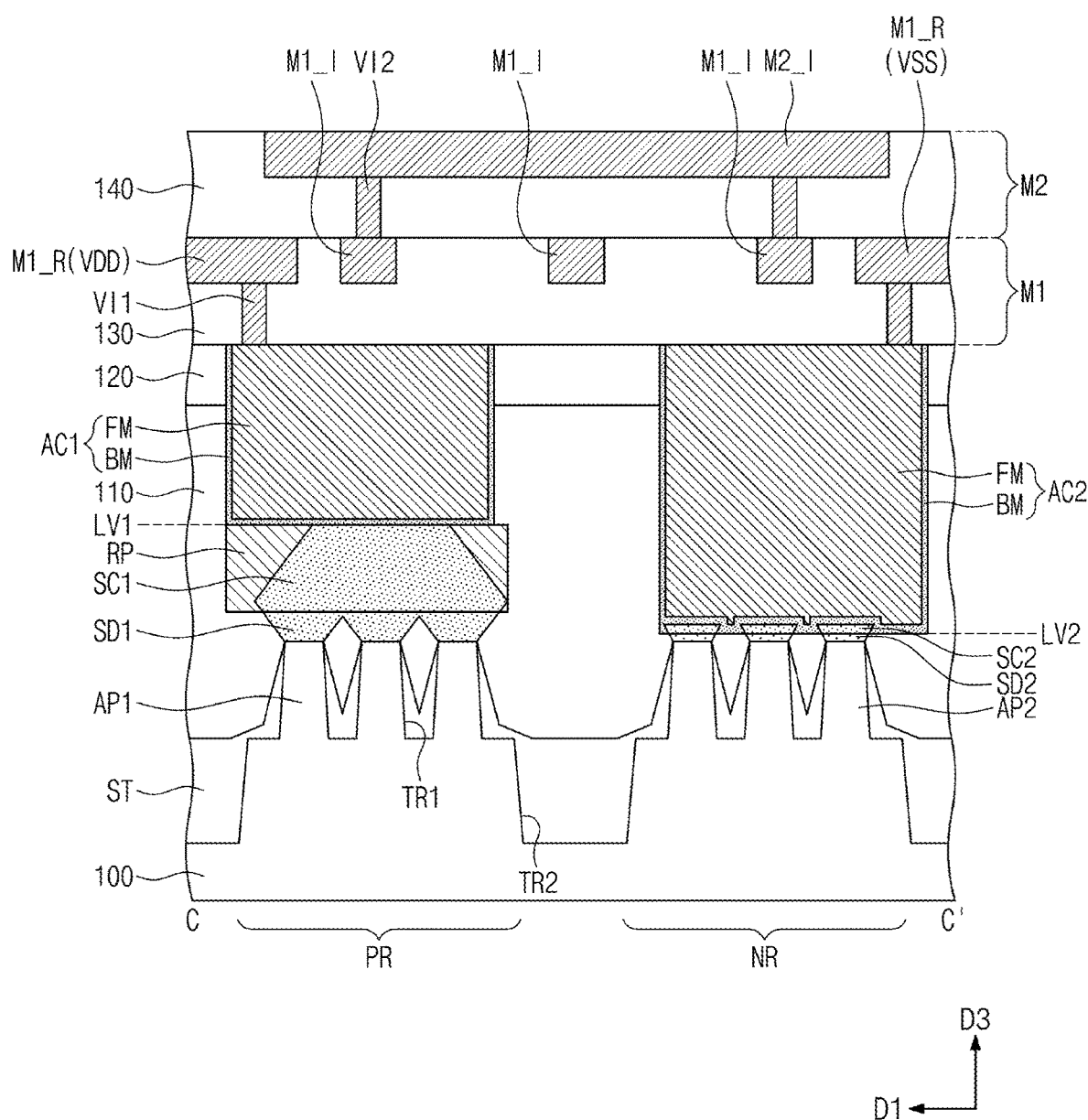
Figure 15D:
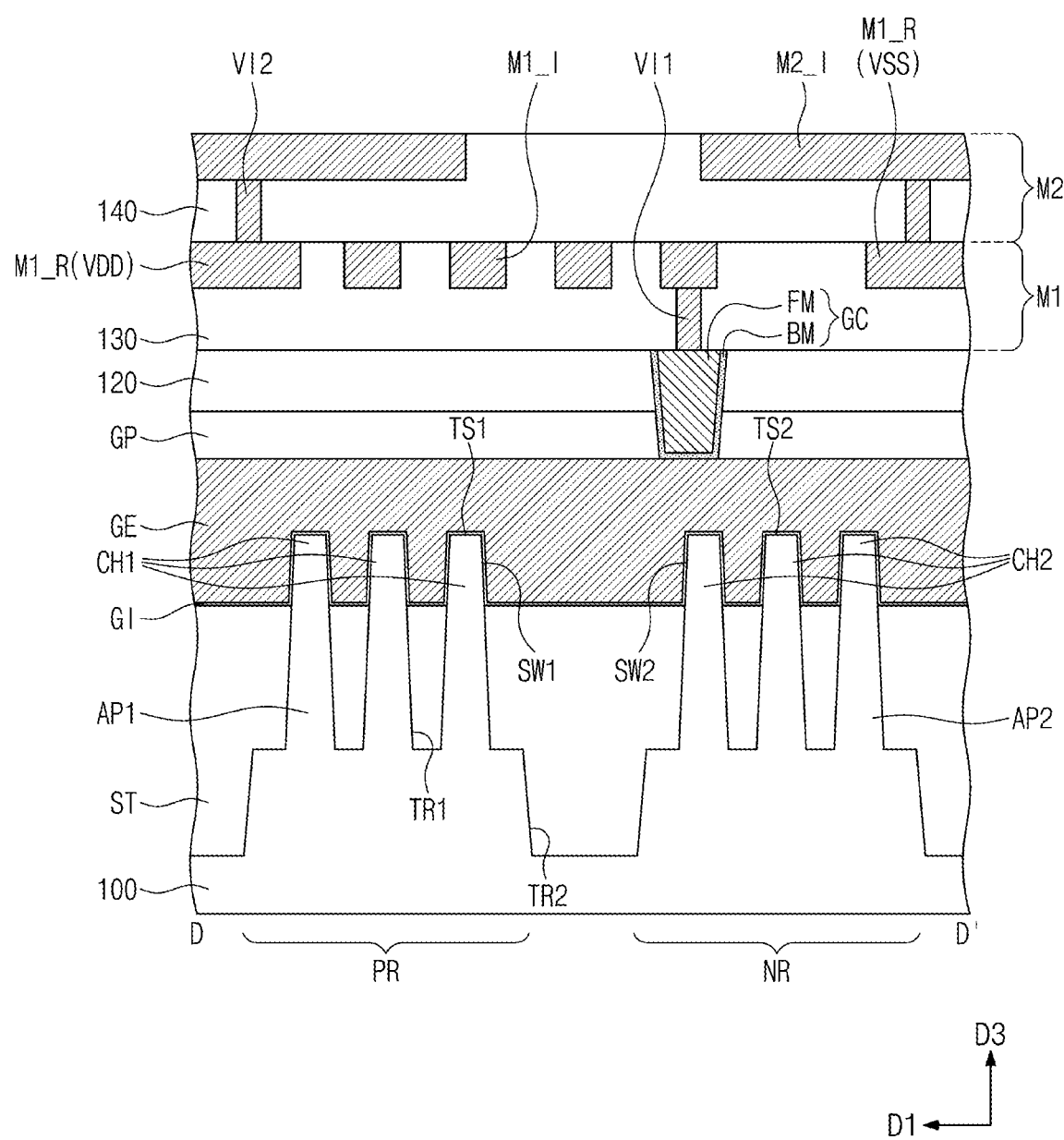

FIG. 14 illustrates a cross-sectional view of section N depicted in FIG. 2B, showing a semiconductor device according to some embodiments. In the embodiment that follows, a detailed description of technical features repetitive to those discussed above with reference to FIGS. 1, 2A to 2D, and 4 will be omitted, and a difference thereof will be discussed in detail.

Referring to FIG. 14, the second active contact AC2 may include an extension part EXP that extends into the second recess RS2 and a body part BOP on the extension part EXP. The extension part EXP of the second active contact AC2 may have a third width W3 as a maximum width thereof. The body part BOP of the second active contact AC2 may have a fourth width W4 as a minimum width thereof. The fourth width W4 may be greater than the third width W3.

The barrier pattern BM of the second active contact AC2 may have a stepwise profile. The barrier pattern BM of the second active contact AC2 may include a step part STP that covers an uppermost surface SC2$u$ of the second silicide pattern SC2.

FIGS. 15A, 15B, 15C, and 15D illustrate cross-sectional views respectively taken along lines A-A', B-B', C-C', and D-D' of FIG. 1, showing a semiconductor device according to some embodiments. In the embodiment that follows, a detailed description of technical features repetitive to those discussed above with reference to FIGS. 1, 2A to 2D, 3, and 4 will be omitted, and a difference thereof will be discussed in detail.

Referring to FIGS. 1 and 15A to 15D, the second trench TR2 formed on the upper portion of the substrate 100 may define the first active region PR and the second active region NR. The first trench TR1 may be defined between neighboring first active patterns AP1 and between neighboring second active patterns AP2. The first trench TR1 may be shallower than the second trench TR2.

The device isolation layer ST may fill the first and second trenches TR1 and TR2. The first and second active patterns AP1 and AP2 may have their upper portions that vertically protrude upward from the device isolation layer ST. The first and second active patterns AP1 and AP2 may each have a fin shape at the upper portion thereof. The device isolation layer ST may cover neither the upper portion of the first active pattern AP1 nor the upper portion of the second active pattern AP2. The device isolation layer ST may cover a lower sidewall of each of the first and second active patterns AP1 and AP2.

The first source/drain patterns SD1 may be provided on the upper portions of the first active patterns AP1. The first source/drain patterns SD1 may be impurity regions having a first conductivity type (e.g., p-type). The first channel pattern CH1 may be interposed between a pair of the first source/drain patterns SD1. The second source/drain patterns SD2 may be provided on the upper portions of the second active patterns AP2. The second source/drain patterns SD2 may be impurity regions having a second conductivity type (e.g., n-type). The second channel pattern CH2 may be interposed between a pair of the second source/drain patterns SD2.

The first and second source/drain patterns SD1 and SD2 may be epitaxial patterns formed by a selective epitaxial growth process. For example, the first and second source/drain patterns SD1 and SD2 may have their top surfaces coplanar with those of the first and second channel patterns CH1 and CH2. In another example, the first and second source/drain patterns SD1 and SD2 may have their top surfaces higher than those of the first and second channel patterns CH1 and CH2.

The gate electrodes GE may be provided to extend in the first direction D1, while running across the first and second active patterns AP1 and AP2. The gate electrodes GE may vertically overlap the first and second channel patterns CH1 and CH2. Each of the gate electrodes GE may surround a top surface and opposite sidewalls of each of the first and second channel patterns CH1 and CH2.

Referring back to FIG. 15D, the gate electrode GE may be provided on a first top surface TS1 and at least one sidewall SW1 of the first channel pattern CH1. The gate electrode GE may be provided on a second top surface TS2 and at least one second sidewall SW2 of the second channel pattern CH2. For example, a transistor according to the present embodiment may be a three-dimensional field effect transistor (e.g., FinFET) in which the gate electrode GE three-dimensionally surrounds the first and second channel patterns CH1 and CH2.

The first and second source/drain patterns SD1 and SD2, the first and second active contacts AC1 and AC2, the first and second silicide patterns SC1 and SC2, the residual pattern RP, the first metal layer M1, and the second metal layer M2 may be substantially the same as those discussed with reference to FIGS. 1 2A to 2D, 3, and 4.

By way of summation and review, embodiments provide a semiconductor device with increased electrical properties. That is, according to embodiments, a first silicide pattern on a PMOSFET region may be formed to have a different profile than a second silicide pattern on an NMOSFET region, i.e., the first silicide pattern may be thicker with a larger volume than the second silicide pattern. On the PMOSFET region, the large volume of the first silicide pattern may effectively provide a compressive stress to a first channel pattern between a pair of first source/drain patterns. Therefore, hole mobility may be increased to induce an improvement in operating speed of the PMOSFETs. As such, a semiconductor device may increase in electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first active region and a second active region;
a first active pattern and a second active pattern on the first active region and the second active region, respectively;
a first source/drain pattern and a second source/drain pattern on the first active pattern and the second active pattern, respectively;
a first silicide pattern and a second silicide pattern on the first source/drain pattern and the second source/drain pattern, respectively, a first thickness of the first silicide pattern being greater than a second thickness of the second silicide pattern; and
a first active contact and a second active contact coupled to the first source/drain pattern and the second active pattern, respectively, a lowermost portion of the first active contact being at a higher level than a lowermost portion of the second active contact,
wherein a low onion of the first silicide pattern is at a lower level than an uppermost portion of the first active pattern.

2. The semiconductor device as claimed in claim 1, wherein the first active region is a PMOSFET region, and the second active region is an NMOSFET region.

3. The semiconductor device as claimed in claim 1, wherein a third thickness of the first source/drain pattern is greater than a fourth thickness of the second source/drain pattern.

4. The semiconductor device as claimed in claim 1, further comprising a first recess and a second recess on an upper portion of the first active pattern and an upper portion of the second active pattern, respectively, the first source/drain pattern and the first silicide pattern completely filling the first recess, and the second source/drain pattern and the second silicide pattern partially filling the second recess.

5. The semiconductor device as claimed in claim 4, wherein the second active contact includes:
an extension part that extends into the second recess to contact an inner sidewall of the second silicide pattern; and
a body part on the extension part.

6. The semiconductor device as claimed in claim 5, wherein a width of the extension part is less than a width of the body part.

7. The semiconductor device as claimed in claim 1, further comprising a channel pattern connected to one of the first source/drain pattern and the second source/drain pattern, the channel pattern including stacked semiconductor patterns that are spaced apart from each other, and a bottom surface of a lowermost one of the stacked semiconductor patterns is at a higher level than a lowermost portion of the first silicide pattern.

8. The semiconductor device as claimed in claim 7, wherein the bottom surface of the lowermost one of the stacked semiconductor patterns is at a higher level than a lowermost portion of the second silicide pattern.

9. The semiconductor device as claimed in claim 1, wherein:
the lowermost portion of the first active contact is at a substantially same level as an uppermost surface of the first silicide pattern, and
the lowermost portion of the second active contact is at a level lower than an uppermost surface of the second silicide pattern.

10. The semiconductor device as claimed in claim 1, wherein each of the first active contact and the second active contact includes:
a conductive pattern; and
a barrier pattern that covers a sidewall of the conductive pattern, the barrier pattern of the second active contact including a step part that covers at least a portion of a top surface of the second silicide pattern.

11. A semiconductor device, comprising:
a substrate including a first active pattern and a second active pattern, the first active pattern and the second active pattern being adjacent to each other in a first direction;
a gate electrode that extends in the first direction and crosses the first active pattern and the second active pattern;
a first recess and a second recess that are on an upper portion of the first active pattern and an upper portion of the second active pattern, respectively;
a first source/drain pattern and a second source/drain pattern that fill a portion of the first recess and a portion of the second recess, respectively;
a first active contact and a second active contact that are coupled to the first source/drain pattern and the second active pattern, respectively;
a first silicide pattern between the first source/drain pattern and the first active contact, the first active contact being in contact with a top surface of the first silicide pattern; and
a second silicide pattern between the second source/drain pattern and the second active contact, the second active contact including a first extension part that extends into the second recess to contact an inner sidewall of the second silicide pattern.

12. The semiconductor device as claimed in claim 11, wherein:
a first thickness of the first silicide pattern is greater than a second thickness of the second silicide pattern, and
a third thickness of the first source/drain pattern is greater than a fourth thickness of the second source/drain pattern.

13. The semiconductor device as claimed in claim 11, wherein a lowermost portion of the first active contact is at a higher level than a lowermost portion of the second active contact.

14. The semiconductor device as claimed in claim 11, wherein the first active contact includes a second extension part that extends into the first recess.

15. The semiconductor device as claimed in claim 11, wherein:

the first source/drain pattern has a p-type conductivity type, and
the second source/drain pattern has an n-type conductivity type.

16. A semiconductor device, comprising:
a substrate including a first active region and a second active region that are adjacent to each other in a first direction;
a first active pattern and a second active pattern that are on the first active region and the second active region, respectively;
a first source/drain pattern on the first active pattern and a second source/drain pattern on the second active pattern;
a first silicide pattern on the first source/drain pattern and a second silicide pattern on the second source/drain pattern;
a first channel pattern connected to the first source/drain pattern and a second channel pattern connected to the second source/drain pattern, each of the first channel pattern and the second channel pattern including a first semiconductor pattern, a second semiconductor pattern, and a third semiconductor pattern that are sequentially stacked and spaced apart from each other;
a gate electrode that extends in the first direction and crosses the first channel pattern and the second channel pattern, the gate electrode including a first part between the substrate and the first semiconductor pattern, a second part between the first semiconductor pattern and the second semiconductor pattern, a third part between the second semiconductor pattern and the third semiconductor pattern, and a fourth part on the third semiconductor pattern;
a gate dielectric layer between the first channel pattern and the gate electrode, and between the second channel pattern and the gate electrode;
a gate spacer on sidewalls of the gate electrode;
a gate capping pattern on a top surface of the gate electrode;
a first interlayer dielectric layer on the gate capping pattern;
a first active contact and a second active contact that penetrate the first interlayer dielectric layer and are respectively coupled to the first source/drain pattern and the second source/drain pattern;
a gate contact that penetrates the first interlayer dielectric layer and is coupled to the gate electrode;
a second interlayer dielectric layer on the first interlayer dielectric layer;
a first metal layer in the second interlayer dielectric layer, the first metal layer including a plurality of lower lines that are correspondingly electrically connected to the gate contact and the first active contact and the second active contact;
a third interlayer dielectric layer on the second interlayer dielectric layer; and
a second metal layer in the third interlayer dielectric layer,
wherein the second metal layer includes a plurality of upper lines that are correspondingly electrically connected to the plurality of lower lines,
wherein a lowermost portion of the first active contact is at a higher level than a lowermost portion of the second active contact, and
wherein a first thickness of the first silicide pattern is greater than a second thickness of the second silicide pattern.

17. The semiconductor device as claimed in claim 16, wherein a bottom surface of the first semiconductor pattern is at a higher level than a lowermost portion of the first silicide pattern.

18. The semiconductor device as claimed in claim 16, further comprising a first recess and a second recess that are on an upper portion of the first active pattern and an upper portion of the second active pattern, respectively, the first source/drain pattern and the first silicide pattern completely filling the first recess, and the second source/drain pattern and the second silicide pattern partially filling the second recess.

19. The semiconductor device as claimed in claim 18, wherein the second active contact includes an extension part that extends into the second recess to contact an inner sidewall of the second silicide pattern.

20. The semiconductor device as claimed in claim 16, wherein the first source/drain pattern includes silicon-germanium, and the second source/drain pattern includes silicon.

\* \* \* \* \*